(12) United States Patent
Constantz et al.

(10) Patent No.: US 10,287,439 B2
(45) Date of Patent: May 14, 2019

(54) CARBONATE PIGMENTS, AND METHODS FOR MAKING AND USING THE SAME

(71) Applicant: Blue Planet, Ltd., Los Gatos, CA (US)

(72) Inventors: Brent R. Constantz, Portola Valley, CA (US); Seung-Hee Kang, San Jose, CA (US)

(73) Assignee: Blue Planet, Ltd., Los Gatos, CA (US)

( * ) Notice: Subject to any disclaimer, the term of this patent is extended or adjusted under 35 U.S.C. 154(b) by 0 days.

(21) Appl. No.: 15/443,798

(22) Filed: Feb. 27, 2017

(65) Prior Publication Data

US 2017/0240747 A1    Aug. 24, 2017

Related U.S. Application Data

(63) Continuation of application No. PCT/US2015/047408, filed on Aug. 28, 2015.

(60) Provisional application No. 62/169,448, filed on Jun. 1, 2015, provisional application No. 62/044,040, filed on Aug. 29, 2014, provisional application No. 62/044,037, filed on Aug. 29, 2014.

(51) Int. Cl.
| | |
|---|---|
| C09C 1/00 | (2006.01) |
| C09C 1/02 | (2006.01) |
| C09C 3/04 | (2006.01) |
| H01L 31/048 | (2014.01) |
| C09C 3/06 | (2006.01) |
| H01L 31/049 | (2014.01) |
| C08K 3/26 | (2006.01) |
| C09C 1/04 | (2006.01) |
| C09C 1/22 | (2006.01) |
| C09D 5/33 | (2006.01) |
| H01L 31/054 | (2014.01) |
| C01B 32/60 | (2017.01) |

(52) U.S. Cl.
CPC ............. *C09C 3/06* (2013.01); *C01B 32/60* (2017.08); *C08K 3/26* (2013.01); *C09C 1/00* (2013.01); *C09C 1/009* (2013.01); *C09C 1/0081* (2013.01); *C09C 1/02* (2013.01); *C09C 1/021* (2013.01); *C09C 1/04* (2013.01); *C09C 1/22* (2013.01); *C09C 3/041* (2013.01); *C09D 5/004* (2013.01); *H01L 31/049* (2014.12); *H01L 31/0481* (2013.01); *H01L 31/0547* (2014.12); *C08K 2003/265* (2013.01); *Y02E 10/52* (2013.01)

(58) Field of Classification Search
CPC ...... C09D 5/004; C08K 3/26; C08K 2003/65; H01L 31/04181; H01L 31/049; H01L 31/0547
See application file for complete search history.

(56) References Cited

U.S. PATENT DOCUMENTS

| | | | |
|---|---|---|---|
| 2,725,310 A * | 11/1955 | McBride | B05D 7/16 148/244 |
| 3,597,251 A | 8/1971 | Kaufman | |
| 4,018,877 A | 4/1977 | Woode | |
| 4,339,477 A | 7/1982 | Bahr et al. | |
| 4,714,603 A | 12/1987 | Vanderheiden | |
| 4,888,160 A | 12/1989 | Kosin et al. | |
| 4,892,590 A | 1/1990 | Gill et al. | |
| 5,006,175 A | 4/1991 | Modly | |
| 5,007,964 A | 4/1991 | Tsukisaka et al. | |
| 5,043,017 A | 8/1991 | Passaretti | |
| 5,120,365 A | 6/1992 | Kogler | |
| 5,164,006 A | 11/1992 | Chapnerkar et al. | |
| 5,531,821 A | 7/1996 | Wu | |
| 5,643,415 A | 7/1997 | Wise | |
| 5,643,631 A | 7/1997 | Donigian et al. | |
| 5,676,747 A * | 10/1997 | Brown | C09C 1/021 106/416 |
| 5,783,038 A | 7/1998 | Donigian et al. | |
| 5,861,209 A | 1/1999 | Haskins et al. | |
| 5,879,442 A | 3/1999 | Nishiguchi et al. | |
| 6,071,336 A | 6/2000 | Fairchild et al. | |
| 6,143,064 A | 11/2000 | Virtanen | |
| 6,174,360 B1 | 1/2001 | Sliwinski et al. | |
| 6,623,555 B1 | 9/2003 | Haverinen et al. | |
| 6,911,239 B2 * | 6/2005 | King | B41M 5/504 428/32.12 |
| 6,989,056 B2 | 1/2006 | Bäbler | |
| 7,641,959 B2 | 1/2010 | Joedicke | |
| 7,829,053 B2 * | 11/2010 | Constantz | B01D 53/1418 423/158 |
| 8,574,712 B2 | 11/2013 | Wood et al. | |
| 9,224,897 B2 * | 12/2015 | Hatakeyama | B32B 27/20 |

(Continued)

FOREIGN PATENT DOCUMENTS

| | | |
|---|---|---|
| CN | 1944542 A * | 4/2007 |
| EP | 1352883 A2 * | 10/2003 |

(Continued)

OTHER PUBLICATIONS

Bendiganavale et al. "Infrared Reflective Inorganic Pigments," Recent Patents on Chemical Engineering, vol. 1, No. 1, 2008, pp. 67-79.

(Continued)

*Primary Examiner* — Anthony J Green

(74) *Attorney, Agent, or Firm* — Bret E. Field; Bozicevic, Field & Francis LLP

(57) ABSTRACT

Carbonate pigment compositions are provided. In some instances, the pigment compositions are CO2 sequestering pigment compositions. Also provided are methods of making and using the pigment compositions, e.g., in paints and coatings, as well as other applications.

20 Claims, 8 Drawing Sheets

(56) References Cited

U.S. PATENT DOCUMENTS

| | | | |
|---|---|---|---|
| 2009/0324482 A1* | 12/2009 | Miller | C01G 3/00 |
| | | | 423/419.1 |
| 2011/0151244 A1 | 6/2011 | Wu et al. | |
| 2011/0305759 A1 | 12/2011 | Koehler | |
| 2012/0269713 A1* | 10/2012 | Berni | C01G 53/06 |
| | | | 423/419.1 |
| 2013/0008346 A1 | 1/2013 | White et al. | |
| 2013/0037098 A1 | 2/2013 | Watanabe et al. | |
| 2013/0276876 A1 | 10/2013 | Kerkar et al. | |
| 2014/0011947 A1* | 1/2014 | Kwon | H01L 31/0487 |
| | | | 524/545 |
| 2014/0166106 A1* | 6/2014 | Shirasaki | H01L 31/0487 |
| | | | 136/256 |
| 2014/0271440 A1 | 9/2014 | Constantz et al. | |
| 2014/0370242 A1 | 12/2014 | Constantz et al. | |
| 2015/0246314 A1 | 9/2015 | Constantz et al. | |
| 2016/0082387 A1 | 3/2016 | Constantz et al. | |
| 2016/0121298 A1 | 5/2016 | Constantz et al. | |
| 2016/0176721 A1 | 6/2016 | Bewernitz et al. | |

FOREIGN PATENT DOCUMENTS

| | | | |
|---|---|---|---|
| JP | 55-54361 A | * | 4/1980 |
| JP | 5-169872 A | * | 7/1993 |
| WO | WO 2014/039578 A1 | | 3/2014 |
| WO | WO 2014/144848 A1 | | 9/2014 |
| WO | WO 2015/134408 A1 | | 9/2015 |
| WO | WO 2016/057709 A2 | | 4/2016 |
| WO | WO 2016/160612 A1 | | 10/2016 |

OTHER PUBLICATIONS

Böttcher et al. "The formation of rhodochrosite-smithsonite ($MnCO_3$—$ZnCO_3$) solid-solutions at 5° C.," Mineralogical Magazine, vol. 59, Sep. 1995, pp. 481-488.

Diebold et al. "TiO2 Scattering Optimization and Not-In-Kind Opacity Alternatives," JCT CoatingsTech, vol. 10, No. 2, Feb. 2013, pp. 30-35.

Dupont, "DuPont™ Ti-Pure® Titanium Dioxide: Titanium Dioxide for Coatings," Marketing Brochure, 2007, 28 pages.

Euro Pacific Canada, "Titanium Dioxide: A Shining Future Ahead," Marketing Brochure, Aug. 2011, 13 pages.

FP-Pigments, Powder Coatings Summit Presentation, Jun. 5, 2013, 36 pages.

Gane et al. "Void Space Structure of Compressible Polymer Spheres and Consolidated Calcium Carbonate Paper-Coating Formulations," Ind. Eng. Chem. Res., vol. 35, No. 5, 1996, pp. 1753-1764.

Gettens et al. "Calcium Carbonate Whites," Studies in Conservation, vol. 19, 1974, pp. 157-184.

Hales et al. "Synthesis and vibrational spectroscopic characterisation of synthetic hydrozincite and smithsonite," Polyhedron, vol. 26, 2007, pp. 4955-4962.

Hallam et al. "Developing optical efficiency through optimized coating structure: biomimetic inspiration from white beetles," Applied Optics, vol. 48, No. 17, Jun. 10, 2009, pp. 3244-3250.

Imerys Minerals Ltd. "Saving TiO2 in Semi-Gloss Emulsion Paints with Supreme," Marketing Brochure, Apr. 2005, 2 pages.

Imerys Minerals Ltd. "Add Imerys Minerals to Reduce $TiO_2$," Marketing Brochure, 2011, 4 pages.

Katsikopoulos et al. "Co-crystallization of Co(II) with calcite: Implications for the mobility of cobalt in aqueous environments," Chemical Geology, vol. 254, 2008, pp. 87-100.

Kaur et al. "Near-infrared reflective properties of perylene derivatives," Dyes and Pigments, vol. 92, 2012 (available online Jul. 12, 2011), pp. 1108-1113.

Landry et al. "IR-Reflective Opaque Water-Based Acrylic Coatings on White Pine Wood Substrates," Progress in Color, Colorants and Coatings, vol. 7, 2014, pp. 61-72.

Levinson et al. "Methods of creating solar-reflective nonwhite surfaces and their application to residential roofing materials," Solar Energy Materials & Solar Cells, vol. 91, 2007, pp. 304-314.

Llorens et al. "New Synthesis Route and Characterization of Siderite (FeCO3) and Coprecipitation of 99Tc," Mater. Res. Soc. Symp. Proc. vol. 985, 2007, 6 pages.

Miller et al. "Special Infrared Reflective Pigments Make a Dark Roof Reflect Almost Like a White Roof," Thermal Performance of the Exterior Envelopes of Buildings, IX, Progress for Proceedings of ASHRAE THERM IX, Clearwater, FL, 2004, 11 pages.

Ohnishi et al. "Synthesis of alkali-metal cobalt kambaldaite by precipitation method," Polyhedron, vol. 28, 2009, pp. 1295-1300.

Reddy et al. "Synthesis and spectroscopic characterisation of aurichalcite $(Zn,Cu^{2+})_5(CO_3)_2(OH)_6$; implications for Cu-ZnO catalyst precursors," Transition. Met. Chem., vol. 33, 2008, pp. 331-339.

Richard, D. "Tedlar's backsheet comeback?" Photon International, Aug. 2013, pp. 44-57.

Solomon et al. "Synthesis of Copper Pigments, Malachite and Verdigris: Making Tempera Paint," Journal of Chemical Education, vol. 88, Jul. 12, 2011, pp. 1694-1697.

Torres-Cancel et al. "Synthesis of Carbonate-Based Micro/Nanoscale Particles With Controlled Morphology and Mineralogy," Design and Synthesis of Bio-Inspired Nanocomposites, U.S. Army Corps of Engineers, Engineer Research and Development Center (ERDC), Apr. 2013, 27 pages.

Wang et al. "Synthesis and characterization of NiTiO3 yellow nano pigment with high solar radiation reflection efficiency," Powder Technology, vol. 235, 2013, pp. 303-306.

Zhang, Z. R. "The Use of Precipitated Calcium Carbonate as $TiO_2$ Extender in Architectural Flat Wall Paint," Date Unknown, 19 pages.

* cited by examiner

CARBONATE PIGMENTS, AND METHODS FOR MAKING AND USING THE SAME

CROSS REFERENCE TO RELATED APPLICATIONS

Under 35 U.S.C. § 119(e), this application claims priority to the filing date of U.S. Provisional Patent Application Ser. No. 62/044,037, filed on Aug. 29, 2014; U.S. Provisional Patent Application Ser. No. 62/044,040, filed on Aug. 29, 2014 and U.S. Provisional Patent Application Ser. No. 62/169,448, filed on Jun. 1, 2015; the disclosures of which applications are incorporated herein by reference.

INTRODUCTION

Pigments are materials that change the color of reflected or transmitted light as the result of wavelength-selective absorption or non-absorption. This physical process differs from fluorescence, phosphorescence, and other forms of luminescence, in which a material emits light. Pigments provide whiteness reflecting substantially of, or color by absorbing and reflecting different parts of, an illumination sources (e.g., sun's) wavelength spectrum based on their chemistry.

White pigments are pigments that contribute light-scattering properties to coatings. White pigments are also known as hiding pigments and are perceived as white by the human eye because they scatter all wavelengths of light, owing to their relatively high refractive index. Titanium dioxide ($TiO_2$) is the most widely used white pigment.

Titanium dioxide ($TiO_2$) is manufactured around the world for use in a variety of applications. For example, titanium dioxide is commonly used as a white pigment in polymer compositions, paint formulations, paper products, and other products. $TiO_2$ is the most important white pigment used in the coatings industry. It is widely used because it efficiently scatters visible light, thereby imparting whiteness, brightness and opacity when incorporated into a coating. Titanium dioxide is commercially available in two crystal structures—anatase and rutile. Rutile $TiO_2$ pigments are preferred because they scatter light more efficiently, are more stable and are more durable than anatase pigments.

Color pigments selectively absorb visible light, and what light they reflect appears to the human eye as color. Pigments also have IR characteristics. While nearly 40% of the sun's energy occurs in the visible light range (400 to 700 nm), more than 50% of the sun's energy is in the non-visible infrared region (700-2500 nm).

In some instances, pigments may be characterized as hot or cool pigments. Cool pigments can be an important component of cool coatings. If a pigment has low infrared absorption, then it's "cool". Conversely, a pigment with high infrared absorption is "hot."

SUMMARY

Carbonate pigment compositions are provided. In some instances, the pigment compositions are $CO_2$ sequestering pigment compositions. Also provided are methods of making and using the pigment compositions, e.g., in coatings and other applications.

DETAILED DESCRIPTION

Figure 1:
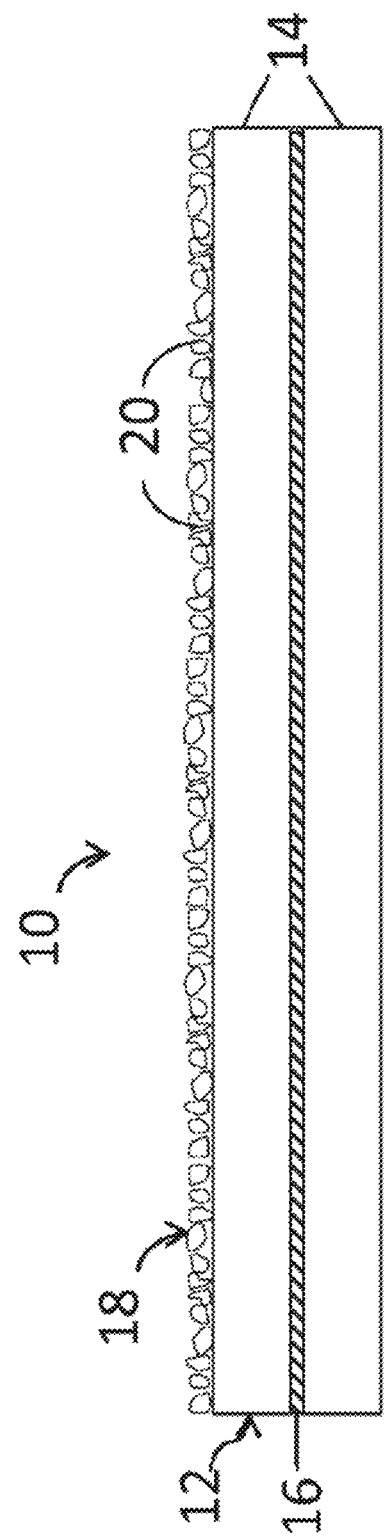
FIG. 1 is a schematic view of a roof shingle according to an embodiment of the invention.

Carbonate pigment compositions are provided. In some instances, the pigment compositions are $CO_2$ sequestering pigment compositions. Also provided are methods of making and using the pigments, e.g., coatings and other applications.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Certain ranges are presented herein with numerical values being preceded by the term "about." The term "about" is used herein to provide literal support for the exact number that it precedes, as well as a number that is near to or approximately the number that the term precedes. In determining whether a number is near to or approximately a specifically recited number, the near or approximating un-recited number may be a number which, in the context in which it is presented, provides the substantial equivalent of the specifically recited number.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Carbonate Pigment Compositions

As summarized above, aspects of the invention include highly reflective carbonate pigment compositions. As reviewed above, pigments are materials that change the color of reflected or transmitted light as the result of wavelength-selective absorption or non-absorption. This physical process differs from fluorescence, phosphorescence, and other forms of luminescence, in which a material emits light. Pigments provide whiteness reflecting substantially of, or color by absorbing and reflecting different parts of, an illumination sources (e.g., sun's) wavelength spectrum based on their chemistry. Embodiments of the invention include both white and cool carbonate pigments.

White Carbonate Pigments

As the compositions of these embodiments are white pigment compositions, they appear white in color to the human eye. As the white pigment compositions appear white to the human eye, they may be true white or light gray in actual color or hue. In some instances, the white pigment compositions reflect 60% or more of incident light, such as 70% or more of incident, e.g., 80% or more, 90% or more, 95% or more, 99% or more, including, in some instances, 100% of incident light e.g., as measured by ASTM C1549.

As the white pigment compositions are highly reflective, they have a high total surface reflectance (TSR) value. The TSR value of the pigment compositions may be determined using any convenient protocol, such as ASTM E1918 Standard Test Method for Measuring Solar Reflectance of Horizontal and Low-Sloped Surfaces in the Field (see also R. Levinson, H. Akbari, P. Berdahl, Measuring solar reflectance—Part II: review of practical methods, LBNL 2010). In some instances, the materials exhibit a TSR value ranging from $Rg;0=0.0$ to $Rg;0,=1.0$, such as $Rg;0,=0.25$ to $Rg;0,=0.99$, including $Rg;0,=0.40$ to $Rg;0,=0.98$, e.g., as measured using the protocol referenced above.

In some instances, the pigment compositions are highly reflective of near infra-red (NIR) light. By NIR light is meant light having a wavelength ranging from 700 nanometers (nm) to 2.5 mm. NIR reflectance may be determined using any convenient protocol, such as ASTM C1371-04a (2010)e1 Standard Test Method for Determination of Emittance of Materials Near Room Temperature Using Portable Emissometers (http://www.astm.org/Standards/C1371.htm) or ASTM G173-03(2012) Standard Tables for Reference Solar Spectral Irradiances: Direct Normal and Hemispherical on 37° Tilted Surface (http://rredc.nrel.gov/solar/spectra/am1.5/ASTMG173/ASTMG173.html). In some instances, the materials exhibit a NIR reflectance value ranging from $Rg;0=0.0$ to $Rg;0=1.0$, such as $Rg;0=0.25$ to $Rg;0=0.99$, including $Rg;0=0.40$ to $Rg;0=0.98$, e.g., as measured using the protocol referenced above.

In some instances, the pigment compositions are highly reflective of ultra-violet (UV) light. By UV light is meant light having a wavelength ranging from 400 nm and 10 nm. UV reflectance may be determined using any convenient protocol, such as ASTM G173-03(2012) Standard Tables for Reference Solar Spectral Irradiances: Direct Normal and Hemispherical on 37° Tilted Surface. In some instances, the materials exhibit a UV value ranging from $Rg;0=0.0$ to $Rg;0=1.0$, such as $Rg;0=0.25$ to $Rg;0=0.99$, including $Rg;0=0.4$ to $Rg;0=0.98$, e.g., as measured using the protocol referenced above.

In some instances, the pigment compositions are highly reflective of visible light. By visible light is meant light having a wavelength ranging from 380 nm to 740 nm. Visible light reflectance properties may be determined using any convenient protocol, such as ASTM G173-03(2012) Standard Tables for Reference Solar Spectral Irradiances: Direct Normal and Hemispherical on 37° Tilted Surface. In some instances, the materials exhibit a visible light reflectance value ranging from $Rg;0=0.0$ to $Rg;0=1.0$, such as $Rg;0=0.25$ to $Rg;0=0.99$, including $Rg;0=0.4$ to $Rg;0=0.98$, e.g., as measured using the protocol referenced above.

The above reflectance properties of the materials may be determined using any convenient protocol, including the specific reflectance determination protocols described in U.S. patent application Ser. No. 14/112,495; the disclosure of which is herein incorporated by reference.

The carbonate pigment compositions described herein exhibit low transmittance from 500 to 2300 nm, where the transmittance across this spectrum, e.g., as determined using the protocol described in the experimental section below, may vary. In some instances, the average transmittance across the 500 to 2300 nm spectrum is 1.0 or less, such as 0.75 or less, 0.5 or less, 0.25 or less, including 0.1 or less. In some instances, the average transmittance across the 400 to 700 nm spectrum is 60% or less, such as 57.5% or less, e.g., 56.5% or less, 56% or less, 48% or less, 36% or less, etc.

The carbonate pigment compositions described herein exhibit a high refractive index. The refractive index of the carbonate pigment compositions may vary, and in some instances is 1.5 or higher, such as 1.6 or higher, 1.7 or higher, 1.8 or higher, 1.9 or higher, 2.0 or higher, where in some instances the refractive index is 3.0 or less, such as 2.9 or less. The term "refractive index" is employed in its conventional sense to refer to the value obtained by dividing the speed-of-light-in-vacuum with the speed-of-light-in-carbonate pigment.

The white carbonate pigment compositions as described herein exhibit high hiding power. The phrase "hiding power" is employed in its conventional sense to refer to the ability of a material to obscure the surface upon which it is applied.

Cool Carbonate Pigments

As summarized above, aspects of the invention include carbonate cool pigment compositions. As the compositions of these embodiments are cool pigment compositions, they have a low infrared absorption characteristic, i.e., they are highly reflective of infrared light, e.g., as compared to non-carbonate materials having the substantially the same, if not the same, color. For example, the NIR reflectance value of a brown cool pigment of the present invention is, in some instances, 10% or greater, such as 25% greater, including 50% or greater, as compared to the NIR reflectance value of a reference or control brown pigment of the same hue which is does not include a transition metal carbonate, e.g., as described herein. The cool pigment compositions described herein are reflective of near infra-red (NIR) light. By NIR light is meant light having a wavelength ranging from 700 nanometers (nm) to 2.5 mm. NIR reflectance may be determined using any convenient protocol, such as ASTM C1371-04a(2010)e1 Standard Test Method for Determination of Emittance of Materials Near Room Temperature Using Portable Emissometers (http://www.astm.org/Standards/C1371.htm) or ASTM G173-03(2012) Standard Tables for Reference Solar Spectral Irradiances: Direct Normal and Hemispherical on 37° Tilted Surface (http://rredc.nrel.gov/solar/spectra/am1.5/ASTMG173/ASTMG173.html). In some instances, the materials exhibit a NIR reflectance value ranging from Rg;0=0.1 to Rg;0=1.0, such as Rg;0=0.15 to Rg;0=0.95, including Rg;0=0.20 to Rg;0=0.90, including Rg;0=0.25 to Rg;0=0.85, including Rg;0=0.30 to Rg;0=0.85, including Rg;0=0.40 to Rg;0=0.85, including Rg;0=0.50 to Rg;0=0.85 e.g., as measured using the protocol referenced above.

The carbonate cool pigment compositions described herein are colored. By "colored" is meant that they are non-white. As such, they do not appear white in color to the human eye. The color of a given carbonate cool pigment composition as described herein may be characterized by the CIELAB color system. As used in the present specification and claims, L*, a* and b* refer to the parameters of the CIELAB color system. As used in the present specification and claims, "colored" means having an L* value of 95 or less, such as 90 or less, including 85 or less, e.g., as measured using the protocol described in the Experimental section, below. In some instances, the pigments have an L* value ranging from 10 to 95, such as 20 to 95 and including 30 to 90. In some instances, the pigments have an a* value ranging from −30 to 30, such as −25 to 25. In some instances, the pigments have a b* value ranging from −20 to 50, such as −15 to 45. The cool pigments may appear to have a variety of different colors, where the colors include, but are not limited to: blacks, grays, browns, violets, purples, blues, teals, greens, yellows, oranges, pinks, reds, etc.

In some instances, the cool pigment compositions described herein have a high total surface reflectance (TSR) value. The TSR value of the pigment compositions may be determined using any convenient protocol, such as ASTM E1918 Standard Test Method for Measuring Solar Reflectance of Horizontal and Low-Sloped Surfaces in the Field (see also R. Levinson, H. Akbari, P. Berdahl, Measuring solar reflectance—Part II: review of practical methods, LBNL 2010). In some instances, the materials exhibit a TSR value ranging from Rg;0=0.1 to Rg;0,=0.9, such as Rg;0,=0.12 to Rg;0,=0.9, including Rg;0,=0.15 to Rg;0,=0.90, e.g., as measured using the protocol referenced above.

In some instances, the cool pigment compositions are reflective of ultra-violet (UV) light. By UV light is meant light having a wavelength ranging from 400 nm and 10 nm. UV reflectance may be determined using any convenient protocol, such as ASTM G173-03(2012) Standard Tables for Reference Solar Spectral Irradiances: Direct Normal and Hemispherical on 37° Tilted Surface. In some instances, the materials exhibit a UV value ranging from Rg;0=0.01 to Rg;0=70, such as Rg;0=0.02 to Rg;0=0.70, including Rg;0=0.03 to Rg;0=0.70, e.g., as measured using the protocol referenced above.

In some instances, the cool pigment compositions are reflective of visible light. By visible light is meant light having a wavelength ranging from 400 nm to 700 nm. Visible light reflectance properties may be determined using any convenient protocol, such as ASTM G173-03(2012) Standard Tables for Reference Solar Spectral Irradiances: Direct Normal and Hemispherical on 37° Tilted Surface. In some instances, the materials exhibit a visible light reflectance value ranging from Rg;0=0.05 to Rg;0=0.90, such as Rg;0=0.10 to Rg;0=0.85, including Rg;0=0.15 to Rg;0=0.85, e.g., as measured using the protocol referenced above.

The above reflectance properties of the materials may be determined using any convenient protocol, including the specific reflectance determination protocols described in U.S. patent application Ser. No. 14/112,495; the disclosure of which is herein incorporated by reference.

The cool carbonate pigment compositions described herein exhibit, in some instances, low transmittance of light ranging in length from 500 to 2300 nm, where the transmittance across this spectrum may, as determined using the protocol described in the Experimental Section below, may vary. In some instances, the average transmittance across the 500 to 2300 nm spectrum is 55.0 or less, such as 0.1 to 55, such as 0.1 to 50, including 0.1 to 40.

Additional Characteristics

The pigment compositions of the invention may be present in a variety of difference formats, such as sheets, blocks, irregular masses etc., where they may or may not be associated with other materials, e.g., as coatings of other materials, etc. In some instances, the pigment compositions are present in a granular configuration, i.e., as a composition made up of small particles, such that the compositions are particulate compositions. While the particle size of the particles making up the pigment compositions may vary, in some instances the particles range in size from 0.001 microns to 10,000 microns, e.g., 0.1 to 5,000 microns, including 0.15 to 2,500 microns, e.g., 0.2 to 100 microns, e.g., as determined by Scanning electron microscopy. In certain embodiments, the particles have a high surface area, e.g., ranging from 0.5 to 100 $m^2/gm$, 0.5 to 50 $m^2/gm$, such as from 0.5 to 2.0 $m^2/gm$, as determined by Brunauer, Emmett, & Teller (BET) Surface Area Analysis. The size distribution of the granules may also vary. In some instances, the weight percent of granules having a size from 0.2 to 100 μm to ranges from 50 to 100 wt. %, such as 55 to 95 wt. %, e.g., 60 to 90 wt. %.

The density, porosity, and permeability of the carbonate granules making up the pigment compositions as described herein may vary as desired. With respect to density, while the density of the granules may vary, in some instances the density ranges from 5 $g/cm^3$ to 0.01 $g/cm^3$, such as 3 $g/cm^3$ to 0.3 $g/cm^3$ and including 2.7 $g/cm^3$ to 0.4 $g/cm^3$. With respect to porosity, as determined by Gas Surface Adsorption as determined by the BET method (Brunauer Emmett Teller (e.g., as described at http://en.wikipedia.org/wiki/BET_theory, S. Brunauer, P. H. Emmett and E. Teller, *J. Am. Chem. Soc.*, 1938, 60, 309)), the porosity may range in some instances from 100 $m^2/g$ to 0.1 $m^2/g$, such as 60 $m^2/g$ to 1 $m^2/g$ and including 40 $m^2/g$ to 1.5 $m^2/g$. With respect to permeability, in some instances the permeability of the material may range from 0.1 to 100 darcies, such as 1 to 10 darcies, including 1 to 5 darcies (e.g., as determined using the protocol described in H. Darcy, Les Fontaines Publiques de la Ville de Dijon, Dalmont, Paris (1856).). Permeability may also be characterized by evaluating water absorption of the material. As determined by water absorption protocol, e.g., the water absorption of the material ranges, in some embodiments, from 0 to 25%, such as 1 to 15% and including from 2 to 9%.

The hardness of the granules making up the pigment compositions may also vary. In some instances, the granules exhibit a Mohs hardness of 3 or greater, such as 5 or greater, including 6 or greater, where the hardness ranges in some instances from 3 to 8, such as 4 to 7 and including 5 to 6 Mohs (e.g., as determined using the protocol described in American Federation of Mineralogical Societies. "Mohs Scale of Mineral Hardness"). Hardness may also be represented in terms of tensile strength, e.g., as determined using the protocol described in ASTM C1167. In some such instances, the material may exhibit a compressive strength of 100 to 3000 N, such as 400 to 2000 N, including 500 to 1800 N.

The mechanical properties of the granules of the pigment compositions may vary. In some instances, the granules have a compressive strength that is 7,500 psi or greater, such as 10,000 psi or greater, including 12,500 psi or greater, e.g., as measured by ASTM. The granules may, in some instances, exhibit a freeze-thaw resistance of 5% max on mass loss or lower, such as 3% max on mass loss or lower, including 2% max on mass loss or lower. The granules may, in some instances, exhibit a wet-dry resistance of 3% max on mass loss or lower, such as 2% max on mass loss or lower, including 1% max on mass loss or lower. The granules may, in some instances, exhibit a spalling resistance of 10% max on mass loss or lower, such as 7.5% max on mass loss or lower, including 5% max on mass loss or lower. The granules may, in some instances, exhibit an abrasion resistance of 1% max or lower, such as 0.5% max or lower, including 2% max or lower, e.g., as measured by the ARMA test method published in Asphalt Roofing Manufacturers Association (ARMA) Granule Test Procedures Manual. The granules may, in some instances, exhibit a temperature stability of 500° C. or greater, such as 600° C. or greater, including 700° or greater. The granules may, in some instances, exhibit a soundness of 2% max on mass loss or lower, such as 1% max on mass loss or lower, including 0.75% max on mass loss or lower, e.g., as measured by the ASTM C88. The granules may, in some instances, exhibit an abrasion and impact resistance of 15% max or lower, such as 12.5% max or lower, including 10% max or lower, e.g., as measured by ASTM C-133.

In some instances, the thermal emittance of the granular composition is 0.5 or higher, such as 0.7 or higher, including 0.8 or higher, e.g., as measured by ASTM C1371. In some instances, the water absorption of the granular composition is 10% or less, such as 5% or less, including 4% or less. In some instances, the UV opacity of the granular composition is 80% or higher, such as 90% or higher, including 95% or higher, e.g., as measured by the ARMA method published in Asphalt Roofing Manufacturers Association (ARMA) Granule Test Procedures Manual. In some instances, the moisture content of the granular composition is 1.0 wt. % or less, such as 0.5 wt. % or less, including 0.3 wt. % or less. In some instances, the granules exhibit a hardness as measured on the Moh's mineral scale of 5.0 or greater, such as 6.0 or greater, including 7.0 or greater, e.g., ranging from 5.0 to 7.0. In some instances, the granules exhibit a bulk density (crushed) which ranges from 60 to 200, such as 75 to 150, e.g., 80 to 115 lb/ft$^3$, e.g., as measured by the ARMA method published in Asphalt Roofing Manufacturers Association (ARMA) Granule Test Procedures Manual. In some instances, the granules exhibit a specific density which ranges from 1.0 to 5.0, such as 2.0 to 4.0, e.g., 2.5 to 3.0. In some instances, the oil absorption of the granular composition is 5% or less, such as 3% or less, including 2% or less.

The granular composition may exhibit a number of additional desirable properties. In some instances, the granular composition exhibits an acid resistance of 5% mass loss or less, such as 3% mass loss or less, including 2% mass loss or less. In some instances, the granular composition is exhibits high weatherability as evidenced by substantially little, if any, degradation after 10,0000 hours. In some instances, the granular composition satisfies the metal leaching standards as specified in EPA title 40, section 162.24 for non-hazardous waste. In some instances, the granular composition exhibits an adhesion to asphalt scrub loss of 5 gm or less, such as 2 gm or less, including 1 gm or less.

The granules of the pigment compositions as described herein are made up of one or more carbonate compounds or minerals, such that the granules of carbonate pigments may be homogeneous or heterogeneous with respect to the carbonate compound(s) from which they are made. In addition, a given pigment composition may be made of a plurality of different homogenous carbonate granules, such that each granule is pure with respect to the carbonate compound of which it is made, but the pigment composition (which is made up of multiple granules) includes two or more different types of homogenous granules that differ from each other with respect to the carbonate compound from which they are made. As such, the carbonate pigment compositions are made up of one or more carbonate compounds, such as two or more different carbonate compounds, e.g., three or more different carbonate compounds, five or more different carbonate compounds, etc., including non-distinct, amorphous carbonate compounds.

Chemical Composition

The carbonate pigment compositions may be made up of one or more carbonate materials, where the carbonate materials may be amorphous or microcrystalline. In some instances, the materials are microcrystalline. As the materials are microcrystalline, the crystal size, e.g., as determined using the Scherrer equation applied to the FWHM of X-ray diffraction pattern, is small, and in some instances is 1000 microns or less in diameter, such as 100 microns or less in diameter, and including 10 microns or less in diameter. In some instances, the crystal size ranges in diameter from 1000 μm to 0.001 μm, such as 10 to 0.001 μm, including 1 to 0.001 μm. In some instances, the crystal size is chosen in view of the wavelength(s) of light that are to be reflected. For example, where light in the visible spectrum is to be reflected, the crystal size range of the materials may be selected to be less than one-half the "to be reflected" range, so as to give rise to photonic band gap. For example, where the to be reflected wavelength range of light is 100 to 1000 nm, the crystal size of the material may be selected to be 50 nm or less, such as ranging from 1 to 50 nm, e.g., 5 to 25 nm. In some embodiments, the materials produced by methods of the invention, e.g., as described in greater detail below, may include rod-shaped crystals and amorphous solids. The rod-shaped crystals may vary in structure, and in certain embodiments have length to diameter ratio ranging from 500 to 1, such as 10 to 1. In certain embodiments, the length of the crystals ranges from 0.5 μm to 500 μm, such as from 5 μm to 100 μm. In yet other embodiments, substantially completely amorphous solids are produced.

The granules of the pigment compositions as described herein are made up of one or more carbonate compounds or minerals, such that the granules of carbonate pigments may be homogeneous or heterogeneous with respect to the carbonate compound(s) from which they are made. In addition, a given pigment composition may be made of a plurality of different homogenous carbonate granules, such that each granule is pure with respect to the carbonate compound of which it is made, but the pigment composition includes two or more different types of homogenous granules that differ from each other with respect to the carbonate compound from which they are made. As such, the carbonate pigment compositions are made up of one or more carbonate polymorphs, such as two or more different carbonate polymorphs, e.g., three or more different carbonate polymorphs, five or more different carbonate polymorphs, etc., including non-distinct, amorphous carbonate polymorphs.

Carbonate compounds of interest that are found in pigment compositions of the invention may be compounds having a molecular formulation $X_m(CO_3)_n$, where X is any element or combination of elements that can chemically bond with a carbonate group or its multiple, wherein X is in certain embodiments an alkaline earth metal and not an alkali metal; wherein m and n are stoichiometric positive integers. These carbonate compounds may have a molecular formula of $X_m(CO_3)_n.H_2O$, where there are one or more structural waters in the molecular formula. The amount of carbonate in the carbonate compounds of the carbonate material, as determined by coulometry using the protocol described as coulometric titration, may be 40% or higher, such as 70% or higher, including 80% or higher. Carbonate compounds of interest are those having a reflectance value across the visible spectrum of 0.8 or greater, such as 0.9 or greater, including 0.95 or greater.

The carbonate compounds may include a number of different cations, such as but not limited to ionic species of: calcium, magnesium, sodium, potassium, sulfur, boron, silicon, strontium, and combinations thereof. Of interest are carbonate compounds of divalent metal cations, such as calcium and magnesium carbonate compounds. Specific carbonate compounds of interest include, but are not limited to: calcium carbonate minerals, magnesium carbonate minerals and calcium magnesium carbonate minerals. Calcium carbonate minerals of interest include, but are not limited to: calcite ($CaCO_3$), aragonite ($CaCO_3$), amorphous vaterite precursor/anhydrous amorphous carbonate ($CaCO_3$), vaterite ($CaCO_3$), ikaite ($CaCO_3.6H_2O$), and amorphous calcium carbonate ($CaCO_3$). Magnesium carbonate minerals of interest include, but are not limited to magnesite ($MgCO_3$), barringtonite ($MgCO_3.2H_2O$), nesquehonite ($MgCO_3.3H_2O$), lanfordite ($MgCO_3.5H_2O$), hydromagnesite, and amorphous magnesium calcium carbonate (Mg-$CaCO_3$). Calcium magnesium carbonate minerals of interest include, but are not limited to dolomite ($(CaMg)(CO_3)_2$), huntite ($Mg_3Ca(CO_3)_4$) and sergeevite ($Ca_2Mg-(CO_3)_{13}.H_2O$). The carbonate compounds may include one or more waters of hydration, or may be anhydrous. In some instances, the amount by weight of magnesium carbonate compounds in the precipitate exceeds the amount by weight of calcium carbonate compounds in the precipitate. For example, the amount by weight of magnesium carbonate compounds in the precipitate may exceed the amount by weight calcium carbonate compounds in the precipitate by 5% or more, such as 10% or more, 15% or more, 20% or more, 25% or more, 30% or more. In some instances, the weight ratio of magnesium carbonate compounds to calcium carbonate compounds in the precipitate ranges from 1.5-5 to 1, such as 2-4 to 1 including 2-3 to 1.

In some instances, the carbonate material may further include hydroxides, such as divalent metal ion hydroxides, e.g., calcium and/or magnesium hydroxides. The carbonate compounds may include one or more components that serve as identifying components, where these one more components may identify the source of the carbonate compounds. For example, identifying components that may be present in product carbonate compound compositions include, but are not limited to: chloride, sodium, sulfur, potassium, bromide, silicon, strontium, magnesium and the like. Any such source-identifying or "marker" elements are generally present in small amounts, e.g., in amounts of 20,000 ppm or less, such as amounts of 2000 ppm or less. In certain embodiments, the "marker" compound is strontium, which may be present in the precipitate incorporated into the aragonite lattice, and make up 10,000 ppm or less, ranging in certain embodiments from 3 to 10,000 ppm, such as from 5 to 5000 ppm, including 5 to 1000 ppm, e.g., 5 to 500 ppm, including 5 to 100 ppm. Another "marker" compound of interest is magnesium, which may be present in amounts of up to 20% mole substitution for calcium in carbonate compounds. The identifying component of the compositions may vary depending on the particular medium source, e.g., ocean water, lagoon water, brine, etc. In certain embodiments, the calcium carbonate content of the carbonate material is 25% w/w or higher, such as 40% w/w or higher, and including 50% w/w or higher, e.g., 60% w/w. The carbonate material has, in certain embodiments, a calcium/magnesium ratio that is influenced by, and therefore reflects, the water source from which it has been precipitated. In certain embodiments, the calcium/magnesium molar ratio ranges from 10/1 to 1/5 Ca/Mg, such as 5/1 to 1/3 Ca/Mg. In certain embodiments, the carbonate material is characterized by having a water source identifying carbonate to hydroxide compound ratio, where in certain embodiments this ratio ranges from 100 to 1, such as 10 to 1 and including 1 to 1.

For cool carbonate pigments, the carbonate pigment compositions may be made up of one or more transition metal carbonate materials, where the carbonate materials may be amorphous or microcrystalline, e.g., as described above. By transition metal carbonate material is meant a composition made up of one or more transition metal carbonate compounds, e.g., a composition that includes transition metal carbonate molecules, where the composition may include a single type of transition metal carbonate or two or more different types of transition metal carbonates, e.g., that differ from each other in terms of the transition metal ion component of the molecule. The transition metal carbonates may vary, and in some instances are period 4 transition metal carbonates, by which is meant that they are carbonates of period 4 transition metals, where period 4 transition metals of interest include, but are not limited to: Mn, Fe, Ni, Cu, Co, Zn. Specific period 4 transition metal carbonates that may be present in the transitional metal carbonate materials include, but are not limited to: $MnCO_3$, $FeCO_3$, $NiCO_3$, $CuCO_3$, $CoCO_3$, $ZnCO_3$, etc, as well as combinations thereof, e.g., $(TM)_m(CO_3)_n)$, wherein TM is a transition metal (e.g., Mn,Fe,Co,Zn,Cu,Ni), and m and n are stoichiometric positive integers.

In addition, the materials and granules described herein may include one or more additional transition metal/non-transition metal carbonates. The phrase "transition metal/non-transition metal carbonate compounds" refers to carbonate compounds that include both a transition metal atom and a non-transition metal atom, e.g., as described above.

Non-transition metal carbonate compounds of interest that may be found in pigment compositions of the invention include those described above. Transition metal/non-transition metal carbonate compounds may be compounds having a molecular formulation $TM_mX_n(CO_3)_n$, where TM and X are as defined above; wherein m and n are stoichiometric positive integers (e.g., $(Ca.Cu)CO_3$). These carbonate compounds may have a molecular formula of $TM_mX_n(CO_3)_n \cdot H_2O$, where there are one or more structural waters in the molecular formula.

In some instances, the granular compositions include a core of a first material with a partial, if not complete, coating of a pigment of the invention, where the pigment may be a white and/or cool carbonate pigment, as desired. In such instances, the core may be any made of any desired material or materials, including but not limited to: calcite, white rock, plagioclase, quartz, zeolite, limestone or marble; quartzite, rhyolite, limestone, etc.; synthetic particles such as refractory grog; crushed porcelain, as well as alumina; silica, as well as non-transition metal carbonate materials, e.g., as described in application serial no. PCT/US2014/029430; the disclosure of which is herein incorporated by reference. The pigment coating layer may vary in thickness, ranging in some instances from 0.001 to 10 mm, such as 0.01 to 5 mm, including 0.1 to 2.5 mm. The pigment coating layer may be white and/or cool carbonate pigment. As such, the coating layer may be just white carbonate pigment, e.g., where with granules are desired, or a cool carbonate pigment, e.g., where colored granules are desired. In some instances, the coated granules include a non-carbonate pigment core, e.g., as described above, coated with first, inner coating of a white carbonate pigment, and then a second, outer coating of a cool carbonate pigment. The overall dimensions of such compositions in some embodiments may be the same as those described for the granules, above. Also of interest are other non-granule structures, e.g., slabs, blocks, sheets, films, or irregular structures, having one or more surfaces coated with a layer of a cool pigment composition, e.g., as described above.

$CO_2$ Sequestering Pigments

In some instances, the carbonate pigment (e.g., white or cool, such as described above) is a $CO_2$ sequestering carbonate pigment. By "$CO_2$ sequestering" is meant that the pigment has been produced from $CO_2$ that is derived from a fuel source used by humans. For example, in some embodiments, a $CO_2$ sequestering material is produced from $CO_2$ that is obtained from the combustion of a fossil fuel, e.g., in the production of electricity. Examples of sources of such $CO_2$ include, but are not limited to, power plants, industrial manufacturing plants, etc., which combust fossil fuels and produce $CO_2$, e.g., in the form of a $CO_2$ containing gas or gases. Examples of fossil fuels include, but are not limited to, oils, coals, natural gasses, tar sands, rubber tires, biomass, shred, etc. Further details on how to produce a $CO_2$ sequestering material are provided below.

The $CO_2$ sequestering carbonate pigments may have an isotopic profile that identifies the component as being of fossil fuel origin and therefore as being $CO_2$ sequestering. For example, in some embodiments the carbon atoms in the $CO_2$ sequestering carbonate pigments reflect the relative carbon isotope composition ($\delta^{13}C$) of the fossil fuel (e.g., coal, oil, natural gas, tar sand) from which the industrial $CO_2$ that was used to make the material was derived. In addition to, or alternatively to, carbon isotope profiling, other isotopic profiles, such as those of oxygen ($\delta^{18}O$), nitrogen ($\delta^{15}N$), sulfur ($\delta^{34}S$), and other trace elements may also be used to identify a fossil fuel source that was used to produce an industrial $CO_2$ source from which a $CO_2$ sequestering material is derived. For example, another marker of interest is ($\delta^{18}O$). Isotopic profiles that may be employed as an identifier of $CO_2$ sequestering materials of the invention are further described in U.S. patent application Ser. No. 14/112,495; the disclosure of which is herein incorporated by reference.

The carbonate pigments, e.g., as described above, may include one or more modifiers that modify the properties of the pigments in some manner. Examples of such modifiers also include physical modifiers. Examples of physical modifier include Si containing compositions, e.g., silicates, colloidal silica, etc. Modifiers of interest further include crystallinity modifiers, e.g., which serve to modify crystallinity or crystal size and composition as desired, e.g., to maintain an amorphous composition. For example phosphate, silica, sulfate, surfactants, or organics such as chitin polysaccharides find use to modify grain boundaries or poison/modify crystal growth.

The carbonate pigments described herein may be fabricated using any convenient protocol. In some instances, the pigment compositions are prepared using a protocol that includes contacting a carbon dioxide ($CO_2$) gas with an aqueous medium to produce a $CO_2$ charged medium, followed by precipitation of carbonate compounds from the $CO_2$ charged medium. In some instances, the carbonate pigments are prepared from a $CO_2$ gas source, which may be either pure $CO_2$ or a multi-component gaseous stream, i.e., a gaseous stream that includes $CO_2$ and one or more additional gaseous components. $CO_2$ containing gaseous streams include gaseous streams containing anthropogenic $CO_2$, e.g., as described in greater detail below.

Aspects of such protocols include contacting a $CO_2$ containing gas with an aqueous medium to remove $CO_2$ from the $CO_2$ containing gas. As mentioned above, the $CO_2$ containing gas may be pure $CO_2$ or be combined with one or more other gasses and/or particulate components, depending upon the source, e.g., it may be a multi-component gas (i.e., a multi-component gaseous stream). In certain embodiments, $CO_2$ containing gas is obtained from an industrial plant, e.g., where the $CO_2$ containing gas is a waste feed from an industrial plant. Industrial plants from which the $CO_2$ containing gas may be obtained, e.g., as a waste feed from the industrial plant, may vary. Industrial plants of interest include, but are not limited to, power plants and industrial product manufacturing plants, such as but not limited to chemical and mechanical processing plants, refineries, cement plants, steel plants, etc., as well as other industrial plants that produce $CO_2$ as a byproduct of fuel combustion or other processing step (such as calcination by a cement plant). Waste feeds of interest include gaseous streams that are produced by an industrial plant, for example as a secondary or incidental product, of a process carried out by the industrial plant.

Of interest in certain embodiments are waste streams produced by industrial plants that combust fossil fuels, e.g., coal, oil, natural gas, as well as man-made fuel products of naturally occurring organic fuel deposits, such as but not limited to tar sands, heavy oil, oil shale, etc. In certain embodiments, power plants are pulverized coal power plants, supercritical coal power plants, mass burn coal power plants, fluidized bed coal power plants, gas or oil-fired boiler and steam turbine power plants, gas or oil-fired boiler simple cycle gas turbine power plants, and gas or oil-fired boiler combined cycle gas turbine power plants. Of interest in certain embodiments are waste streams produced by power plants that combust syngas, i.e., gas that is produced by the gasification of organic matter, e.g., coal, biomass, etc., where in certain embodiments such plants are integrated gasification combined cycle (IGCC) plants. Of interest in certain embodiments are waste streams produced by Heat Recovery Steam Generator (HRSG) plants. Waste streams of interest also include waste streams produced by cement plants. Cement plants whose waste streams may be employed in methods of the invention include both wet process and dry process plants, which plants may employ shaft kilns or rotary kilns, and may include pre-calciners. Each of these types of industrial plants may burn a single fuel, or may burn two or more fuels sequentially or simultaneously. A waste stream of interest is industrial plant exhaust gas, e.g., a flue gas. By "flue gas" is meant a gas that is obtained from the products of combustion from burning a fossil or biomass fuel that are then directed to the smokestack, also known as the flue of an industrial plant.

In producing the $CO_2$ sequestering material from a $CO_2$-containing gas, a $CO_2$-containing gas may be contacted with an aqueous medium under conditions sufficient to remove $CO_2$ from the $CO_2$-containing gas and produce a bicarbonate component, which bicarbonate component may then be contacted with a cation source to produce a carbonate $CO_2$ sequestering component. The aqueous medium may vary, ranging from fresh water to bicarbonate buffered aqueous media. Bicarbonate buffered aqueous media employed in embodiments of the invention include liquid media in which a bicarbonate buffer is present. As such, liquid aqueous media of interest include dissolved $CO_2$, water, carbonic acid ($H_2CO_3$), bicarbonate ions ($HCO_3^-$), protons ($H^+$) and carbonate ions ($CO_3^{2-}$). The constituents of the bicarbonate buffer in the aqueous media are governed by the equation:

$$CO_2 + H_2O \rightleftarrows H_2CO_3 \rightleftarrows H^+ + HCO_3^- \rightleftarrows 2H^+ + CO_3^{2-}$$

The pH of the bicarbonate buffered aqueous media may vary, ranging in some instances from 7 to 11, such as 8 to 11, e.g., 8 to 10, including 8 to 9. In some instances, the pH ranges from 8.2 to 8.7, such as from 8.4 to 8.55. The bicarbonate buffered aqueous medium may be a naturally occurring or man-made medium, as desired. Naturally occurring bicarbonate buffered aqueous media include, but are not limited to, waters obtained from seas, oceans, lakes, swamps, estuaries, lagoons, brines, alkaline lakes, inland seas, etc. Man-made sources of bicarbonate buffered aqueous media may also vary, and may include brines produced by water desalination plants, and the like. Of interest in some instances are waters that provide for excess alkalinity, which is defined as alkalinity that is provided by sources other than bicarbonate ion. In these instances, the amount of excess alkalinity may vary, so long as it is sufficient to provide 1.0 or slightly less, e.g., 0.9, equivalents of alkalinity. Waters of interest include those that provide excess alkalinity (meq/liter) of 30 or higher, such as 40 or higher, 50 or higher, 60 or higher, 70 or higher, 80 or higher, 90 or higher, 100 or higher, etc. Where such waters are employed, no other source of alkalinity, e.g., NaOH, is required.

In some instances, the aqueous medium that is contacted with the $CO_2$ containing gas is one which, in addition to the bicarbonate buffering system (e.g., as described above), further includes an amount of divalent cations. Inclusion of divalent cations in the aqueous medium can allow the concentration of bicarbonate ion in the bicarbonate rich product to be increased, thereby allowing a much larger amount of $CO_2$ to become sequestered as bicarbonate ion in the bicarbonate rich product. In such instances, bicarbonate ion concentrations that exceed 5,000 ppm or greater, such as 10,000 ppm or greater, including 15,000 ppm or greater may be achieved. For instance, calcium and magnesium occur in seawater at concentrations of 400 and 1200 ppm respectively. Through the formation of a bicarbonate rich product using seawater (or an analogous water as the aqueous medium), bicarbonate ion concentrations that exceed 10,000 ppm or greater may be achieved.

In such embodiments, the total amount of divalent cation source in the medium, which divalent cation source may be made up of a single divalent cation species (such as $Ca^{2+}$) or two or more distinct divalent cation species (e.g., $Ca^{2+}$, $Mg^{2+}$, etc.), may vary, and in some instances is 100 ppm or greater, such as 200 ppm or greater, including 300 ppm or greater, such as 500 ppm or greater, including 750 ppm or greater, such as 1,000 ppm or greater, e.g., 1,500 ppm or greater, including 2,000 ppm or greater. Divalent cations of interest that may be employed, either alone or in combination, as the divalent cation source include, but are not limited to: $Ca^{2+}$, $Mg^{2+}$, $Be^{2+}$, $Ba^{2+}$, $Sr^{2+}$, $Pb^{2+}$, $Fe^{2+}$, $Hg^{2+}$ and the like. Other cations of interest that may or may not be divalent include, but are not limited to: $Na^+$, $K^+$, $NH_4^+$, and $Li^+$, as well as cationic species of Mn, Ni, Cu, Zn, Cu, Ce, La, Al, Y, Nd, Zr, Gd, Dy, Ti, Th, U, La, Sm, Pr, Co, Cr, Te, Bi, Ge, Ta, As, Nb, W, Mo, V, etc. Naturally occurring aqueous media which include a cation source, divalent or otherwise, and therefore may be employed in such embodiments include, but are not limited to: aqueous media obtained from seas, oceans, estuaries, lagoons, brines, alkaline lakes, inland seas, etc.

Contact of the $CO_2$ containing gas and bicarbonate buffered aqueous medium is carried out under conditions sufficient to remove $CO_2$ from the $CO_2$ containing gas (i.e., the $CO_2$ containing gaseous stream), and increase the bicarbonate ion concentration of the buffered aqueous medium to produce a bicarbonate rich product. The bicarbonate rich product is, in some instances, a two phase liquid which includes droplets of a liquid condensed phase (LCP) in a bulk liquid, e.g., bulk solution. By "liquid condensed phase" or "LCP" is meant a phase of a liquid solution which includes bicarbonate ions wherein the concentration of bicarbonate ions is higher in the LCP phase than in the surrounding, bulk liquid.

LCP droplets are characterized by the presence of a meta-stable bicarbonate-rich liquid precursor phase in which bicarbonate ions associate into condensed concentrations exceeding that of the bulk solution and are present in a non-crystalline solution state. The LCP contains all of the components found in the bulk solution that is outside of the interface. However, the concentration of the bicarbonate ions is higher than in the bulk solution. In those situations where LCP droplets are present, the LCP and bulk solution may each contain ion-pairs and pre-nucleation clusters (PNCs). When present, the ions remain in their respective phases for long periods of time, as compared to ion-pairs and PNCs in solution.

The bulk phase and LCP are characterized by having different $K_{eq}$, different viscosities, and different solubilities between phases. Bicarbonate, carbonate, and divalent ion constituents of the LCP droplets are those that, under appropriate conditions, may aggregate into a post-critical nucleus, leading to nucleation of a solid phase and continued growth. While the association of bicarbonate ions with divalent cations, e.g., $Ca^{2+}$, in the LCP droplets may vary, in some instances bidentate bicarbonate ion/divalent cation species may be present. For example, in LCPs of interest, $Ca^{2+}$/bicarbonate ion bidentate species may be present. While the diameter of the LCP droplets in the bulk phase of the LCP may vary, in some instances the droplets have a diameter ranging from 1 to 500 nm, such as 10 to 100 nm. In the LCP, the bicarbonate to carbonate ion ratio, (i.e., the $HCO_3^-/CO_3^{2-}$ ratio) may vary, and in some instances is 10 or greater to 1, such as 20 or greater to 1, including 25 or greater to 1, e.g., 50 or greater to 1. Additional aspects of LCPs of interest are found in Bewernitz et al., "A metastable liquid precursor phase of calcium carbonate and its interactions with polyaspartate," Faraday Discussions. 7 Jun. 2012. DOI: 10.1039/c2fd20080e (2012) 159: 291-312. The presence of LCPs may be determined using any convenient protocol, e.g., the protocols described in Faatz et al., Advanced Materials, 2004, 16, 996-1000; Wolf et al., Nanoscale, 2011, 3, 1158-1165; Rieger et al., Faraday Discussions, 2007, 136, 265-277; and Bewernitz et al., Faraday Discussions, 2012, 159, 291-312.

Where the bicarbonate rich product has two phases, e.g., as described above, the first phase may have a higher concentration of bicarbonate ion than a second phase, where the magnitude of the difference in bicarbonate ion concentration may vary, ranging in some instances from 0.1 to 4, such as 1 to 2. For example, in some embodiments, a bicarbonate rich product may include a first phase in which the bicarbonate ion concentration ranges from 1000 ppm to 5000 ppm, and a second phase where the bicarbonate ion concentration is higher, e.g., where the concentration ranges from 5000 ppm to 6000 ppm or greater, e.g., 7000 ppm or greater, 8000 ppm or greater, 9000 ppm or greater, 10,000 ppm or greater, 25,000 ppm or greater, 50,000 ppm or greater, 75,000 ppm or greater, 100,000 ppm, 500,000 or greater.

In addition to the above characteristics, a given bicarbonate rich product may include a number of additional markers which serve to identify the source of $CO_2$ from it has been produced. For example, a given bicarbonate component may include markers which identify the water from which it has been produced. Waters of interest include naturally occurring waters, e.g., waters obtained from seas, oceans, lakes, swamps, estuaries, lagoons, brines, alkaline lakes, inland seas, as well as man-made waters, e.g., brines produced by water desalination plants, and the like. In such instances, markers that may be present include amounts of one or more of the following elements: Ca, Mg, Be, Ba, Sr, Pb, Fe, Hg, Na, K, Li, Mn, Ni, Cu, Zn, Cu, Ce, La, Al, Y, Nd, Zr, Gd, Dy, Ti, Th, U, La, Sm, Pr, Co, Cr, Te, Bi, Ge, Ta, As, Nb, W, Mo, V, etc. Alternatively or in addition to the above markers, a given bicarbonate component may include markers which identify the particular $CO_2$-containing gas used to produce the bicarbonate component. Such markers may include, but are not limited to, one or more of: nitrogen, mononitrogen oxides, e.g., NO, $NO_2$, and $NO_3$, oxygen, sulfur, monosulfur oxides, e.g., SO, $SO_2$ and $SO_3$), volatile organic compounds, e.g., benzo(a)pyrene $C_2OH_{12}$, benzo(g,h,l)perylene $C_{22}H_{12}$, dibenzo(a,h)anthracene $C_{22}H_{14}$, etc. Particulate components that may be present in the $CO_2$ containing gas from which the bicarbonate component is produced and therefore which may be present in the bicarbonate component include, but are not limited to particles of solids or liquids suspended in the gas, e.g., heavy metals such as strontium, barium, mercury, thallium, etc. When present, such markers may vary in their amounts, ranging in some instances from 0.1 to 10,000, such as 1 to 5,000 ppm. Of interest in certain embodiments are agents (referred to herein as "bicarbonate promoters" or "BLCP promoters") that promote the production of high-bicarbonate-content bicarbonate additive (which may also be referred to herein as a bicarbonate admixture), e.g., by promoting the production and/or stabilization of BLCPs, e.g., facilitating the formation of a BLCP in a bicarbonate-containing solution while preventing precipitation of the solution's components to form solid carbonate-containing materials. A high-bicarbonate-content bicarbonate component is one that has a bicarbonate content of 0.1 wt. % or greater, such as 4 wt. % or greater, including 10 wt. % or greater, such as a bicarbonate component having a bicarbonate content ranging from 5 to 40 wt. %, such as 10 to 20 wt. %. The amount of bicarbonate promoter present in a given bicarbonate component may vary, where in some instances the amount ranges from 0.000001 wt. % to 40 wt. %, such as 0.0001 to 20 wt. % and including 0.001 to 10 wt. %. Such promoters are further described in U.S. patent application Ser. No. 14/112,495; the disclosure of which is herein incorporated by reference.

As indicated above, in making a $CO_2$ sequestering material according to certain embodiments of the invention, the $CO_2$ containing gas is contacted with an aqueous medium under conditions sufficient to produce the bicarbonate-rich product. The $CO_2$ containing gas may be contacted with the aqueous medium using any convenient protocol. For example, contact protocols of interest include, but are not limited to: direct contacting protocols, e.g., bubbling the gas through a volume of the aqueous medium, concurrent contacting protocols, i.e., contact between unidirectionally flowing gaseous and liquid phase streams, countercurrent protocols, i.e., contact between oppositely flowing gaseous and liquid phase streams, and the like. Contact may be accomplished through use of infusers, bubblers, fluidic Venturi reactors, spargers, gas filters, sprays, trays, or packed column reactors, and the like, as may be convenient. The process may be a batch or continuous process.

Contact occurs under conditions such that a substantial portion of the $CO_2$ present in the $CO_2$ containing gas goes into solution to produce bicarbonate ions. In some instances, 5% or more, such as 10% or more, including 20% or more of all the bicarbonate ions in the initial expanded liquid phase solution (mother liquor) become sequestered in LCPs. Where desired, the $CO_2$ containing gas is contacted with the bicarbonate buffered aqueous medium in the presence of a catalyst (i.e., an absorption catalyst) that mediates the conversion of $CO_2$ to bicarbonate. Catalysts of interest are further described in U.S. patent application Ser. No. 14/112,495; the disclosure of which is herein incorporated by reference.

Following preparation of the bicarbonate rich product (as well as any storage thereof, as desired), the bicarbonate rich product or component thereof (e.g., LCP) is manipulated to produce solid phase carbonate compositions, and therefore sequester $CO_2$ from the initial $CO_2$ containing gas into a solid form and produce a $CO_2$ sequestering material, which may be a highly reflective material of the invention, e.g., a material having reflective properties, such as described above. In certain instances of such embodiments, the bicarbonate rich product or component thereof (e.g., LCP) is combined with a cation source (e.g., a source of one or more alkaline earth metal cations) under conditions sufficient to produce a solid carbonate composition. Cations of different valances can form solid carbonate compositions (e.g., in the form of carbonate minerals). In some instances, monovalent cations, such as sodium and potassium cations, may be employed. In other instances, divalent cations, such as alkaline earth metal cations, e.g., calcium and magnesium cations, may be employed. When cations are added to the bicarbonate rich product or component thereof (e.g., LCP), precipitation of carbonate solids, such as amorphous calcium carbonate when the divalent cations include $Ca^{2+}$, may be produced with a stoichiometric ratio of one carbonate-species ion per cation.

In producing cool pigments of the invention, carbonate precipitation occurs in the presence of one or more transition metal cations. The transition metal cations may vary, where in some instances the transition metal cations are period 4 transition metal cations, such as but not limited to: Mn, Fe, Ni, Cu, Co, Zn cations. Precipitation may occur in the presence of a single transition metal cation, or in the presence of two or more distinct transition metal cations, e.g., 3 or more, including 4 or more distinct transition metal cations. The transitional metal cation or cations that are present during precipitation may vary, and in some instances are chosen based on the desired color of the precipitated product. For example, where brown pigments are desired, transition metal cations of interest include Mn cations, Fe cations, Co cations, Cu cations, Ni cations, and combinations of two or more thereof. Further guidance regarding transition metal ions and the colors obtainable therefrom is provided in the Experimental section, below.

Any convenient cation source may be employed in such instances. Cation sources of interest include, but are not limited to, the brine from water processing facilities such as sea water desalination plants, brackish water desalination plants, groundwater recovery facilities, wastewater facilities, and the like, which produce a concentrated stream of solution high in cation contents. Also of interest as cation sources are naturally occurring sources, such as but not limited to native seawater and geological brines, which may have varying cation concentrations and may also provide a ready source of cations to trigger the production of carbonate solids from the bicarbonate rich product or component thereof (e.g., LCP). For production of cool pigments, transition metal cation sources of interest include transition metal salts, e.g., $MnCl_2$, $CuCl_2$, $CoCl_2$, $NiCl_2$, $ZnCl_2$, $FeCl_2$, etc. For any given precipitation, a single transition metal cation source, e.g., transition metal salt, may be employed, or two or more, such as three or more, including four or more distinct sources that differ from each other with respect to transition metal element, may be employed, as desired. The cation source employed in such solid carbonate production steps may be the same as or different from the aqueous media employed in the bicarbonate rich product production step, e.g., as described above. For example, the aqueous medium employed to produce a bicarbonate rich product may be native seawater with a calcium cation concentration of approximately 400 ppm. A more concentrated cation solution, such as the brine concentrate from a seawater desalination plant, with over twice the native seawater concentration of calcium cation, may then be employed for the second precipitation step.

During the production of solid carbonate compositions from the bicarbonate rich product or component thereof (e.g., LCP), one mol of $CO_2$ may be produced for every 2 mols of bicarbonate ion from the bicarbonate rich product or component thereof (e.g., LCP). For example, where solid carbonate compositions are produced by adding calcium cation to the bicarbonate rich product or component thereof (e.g., LCP), the production of solid carbonate compositions, e.g., the form of amorphous calcium carbonate minerals, may proceed according to the following reaction:

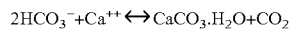
$$2HCO_3^- + Ca^{++} \leftrightarrow CaCO_3 \cdot H_2O + CO_2$$

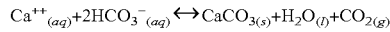
$$Ca^{++}_{(aq)} + 2HCO_3^-_{(aq)} \leftrightarrow CaCO_{3(s)} + H_2O_{(l)} + CO_{2(g)}$$

While the above reaction shows the production of 1 mol of $CO_2$, 2 moles of $CO_2$ from the $CO_2$ containing gas were initially converted to bicarbonate. As such, the overall process sequesters a net 1 mol of $CO_2$ and therefore is an effective $CO_2$ sequestration process, with a downhill thermodynamic energy profile of $-34$ kJ $mol^{-1}$ for the above reaction.

In producing the $CO_2$ sequestering material from a $CO_2$-containing gas, a $CO_2$-containing gas may be contacted with an aqueous medium under conditions sufficient to remove $CO_2$ from the $CO_2$-containing gas and produce the bicarbonate component, e.g., as described above. While any convenient protocol may be employed, protocols of interest include, but are not limited to, those described in U.S. patent application Ser. No. 14/112,495; the disclosure of which is herein incorporated by reference.

Also of interest as $CO_2$ sequestering materials are compounds produced using carbonate mediated sequestration protocols, i.e., alkaline intensive protocols, in which a $CO_2$ containing gas is contacted with an aqueous medium at pH of about 10 or more. Examples of such protocols include, but are not limited to, those described in U.S. Pat. Nos. 8,333,944; 8,177,909; 8,137,455; 8,114,214; 8,062,418; 8,006,446; 7,939,336; 7,931,809; 7,922,809; 7,914,685; 7,906,028; 7,887,694; 7,829,053; 7,815,880; 7,771,684; 7,753,618; 7,749,476; 7,744,761; and 7,735,274; the disclosures of which are herein incorporated by reference.

Further Processing

The initial carbonate precipitate composition, e.g., as described above, may be further processed to produce a granular carbonate pigment composition as desired. In some instances, an initial precipitate carbonate composition, e.g., as described above, is subjected to elevated pressure and or combined with a setting liquid in a manner sufficient to produce a solid product, which resultant solid product may then be disrupted as desired to produce a granular composition. When subjected to pressure, an initial particulate composition (which may or may not be $CO_2$ sequestering, such as described above), is subjected to elevated pressures for a period of time sufficient to produce a desired solid product. In some instances, the elevated pressures range from 1,000 to 100,000 psi, such as 1,500 to 50,000 psi and including 2,000 to 25,000 psi. The period of time to which the composition is subjected to elevated pressures may vary, and in some instances ranges from 1 second to 24 hours, such as 30 seconds to 30 minutes.

In some instances, the initial carbonate composition may be combined with a setting liquid. Setting liquids of interest vary, and in some instances are aqueous liquid that include one or more solutes, e.g., magnesium, calcium, carbonate, bicarbonate, chloride, strontium, sodium, silicates (including but not limited to those described in U.S. Pat. Nos. 6,375,935 and 6,719,993, the disclosures of which are herein incorporated by reference), etc. When present, these solutes may vary in concentration, ranging in some instances from 1 to 10 mM, such as 1 to 5 mM. Where desired, the setting liquids may further include a source of silica, e.g., colloidal silica, etc. When combined with a setting liquid, the liquid to solid weight ratio may vary, ranging in some instances from 0.1 to 1.0, such as 0.2 to 0.5. When a setting liquid is employed in combination with elevated pressure, the setting liquid may be combined with the initial carbonate composition first and the resultant product, e.g., slurry or paste, may be subjected to elevated pressure, e.g., as described above. When pastes or slurries are prepared, where desired such may be subjected to extrusion and/or dewatering.

Where desired, the resultant solid product may be cured for a period of time following production. The curing period of time may vary, ranging in some instances from 1 day to 2 months, such as 1 day to 14 days and including 3 days to 7 days. The product may be cured in air at a convenient temperature, such as a temperature ranging from 0 to 100° C., such as 15 to 60° C. In some instances, curing increases the solar reflectance of the material, e.g., by 2% or more, such as 5% or more, including 10% or more, e.g., 15% or more, as compared to a non-cured control, where in some instances the increase in solar reflectance (SR) ranges from 2 to 20%, such as 2 to 17.5%. In other instances, the product may be cured in a curing liquid, such as but not limited to, aqueous liquids, e.g., water, salt solutions, sea water like solutions, solutions containing LCP, solutions containing bicarbonate ion, solutions containing carbonate ion, solutions containing strontium, solutions containing magnesium calcium chloride, solutions containing ammonium ion, solutions containing acetate ion, and the like.

Where desired, one or more additional components may be combined with the carbonate component at some point during the production protocol, as desired. Additional components that may be combined with the carbonate component may vary, where examples include, but are not limited to, powder consolidation materials, stearate, antifungal agents, compound eluting agents, pigments (such as described in greater detail below); etc.

Following production, the solid product may be disrupted to produce the desired granular composition. The solid product may be disrupted using any convenient protocol, e.g., milling, crushing or granulation using such devices as a jaw, rotor, mortar, crushing, disk, or beater mill, a hammer mill or a screen mill-granulator or reduction device, strong acid/base, and the like.

A given granular carbonate pigment composition may be made up of just the carbonate pigment granules, e.g., white and/or cool pigments, such as described above, or include one or more additional components, such as but not limited to binders, delivery vehicles, other agents that impart functionality to the compositions, UV absorbers, pigments (both white pigments and colored or hued (i.e., non-white) pigments), biocides, algaecides, etc., which may vary widely depending on the intended use of the composition. As such, a given portion or amount of a granular carbonate pigment composition as described herein may be made up of a single type of carbonate pigment granules, e.g., as described above, such that it is homogeneous or pure with respect to the carbonate pigment granules of which it is made, or may be made up of two or more distinct components (one of which is a carbonate pigment granule component), such that it is heterogeneous. As summarized above, a variety of additional components may be included to make up the pigment compositions, where such compounds include, but are not limited to: pigments, e.g., as described in greater detail below, biocides (algaecides), fillers, binders, etc. Depending on the nature of the second component, the second component may be distinct from the carbonate granules or integral with the carbonate granules, e.g., associated with at least a portion of the surface of the granules or present in the interior of the granules.

In some instances, a given composition that includes the carbonate granular pigment composition as described herein may include a second pigment, e.g., where the second pigment component may be a distinct component mixed or combined with the granular white carbonate pigment composition in a heterogeneous composition, or the second pigment may be integral part of the granules of the granular composition, e.g., where the second pigment is found either coated onto at least a portion of the surface of the carbonate pigment granules or found throughout the carbonate pigment granules (including the interior of the granules). In some instances, the pigment may be a second white pigment, e.g., $TiO_2$. In such instances, the composition may be a white pigment composition that is a blend of a carbonate pigment as described herein and a $TiO_2$ pigment. The ratio of the different white pigments may vary in such blends, where the ratio in some instances of a carbonate pigment to second white pigment ranges from 10 to 0.5, such as 5 to 1, e.g., 3 to 1, including 2 to 1. In some instances, the composition is a blend of white and cool carbonate pigments, e.g., as described above. In such instances, the composition may be a white/cool pigment blend composition that is a blend of a white and cool carbonate pigments as described herein. The ratio of the different pigments may vary in such blends, where the ratio in some instances of a cool pigment to white pigment ranges from 10 to 0.5, such as 5 to 1, e.g., 3 to 1, including 2 to 1.

Also of interest are non-carbonate colored pigments, which may be present with the pigments of the present invention in some instances. Pigments of interest include, but are not limited to: metal based pigments, e.g., Cadmium pigments: cadmium yellow, cadmium red, cadmium green, cadmium orange, cadmium sulfoselenide; Chromium pigments: chrome yellow and chrome green; Cobalt pigments: cobalt violet, cobalt blue, cerulean blue, aureolin (cobalt yellow); Copper pigments: Azurite, Han purple, Han blue, Egyptian blue, Malachite, Paris green, Phthalocyanine Blue BN, Phthalocyanine Green G, verdigris, viridian; Iron oxide pigments: sanguine, caput mortuum, oxide red, red ochre, Venetian red, Prussian blue; Lead pigments: lead white, cremnitz white, Naples yellow, red lead; Manganese pigments: manganese violet; Mercury pigments: vermilion; Titanium pigments: titanium yellow, titanium beige, titanium white, titanium black and Zinc pigments: zinc white, zinc ferrite; inorganic pigments, such as Carbon pigments: carbon black (including vine black, lamp black), ivory black (bone char); Clay earth pigments (iron oxides): yellow ochre, raw sienna, burnt sienna, raw umber, burnt umber; Ultramarine pigments: ultramarine, ultramarine green shade; biological and organic pigments, e.g., pigments of biological origin: alizarin (synthesized), alizarin crimson (synthesized), gamboge, cochineal red, rose madder, indigo, Indian yellow, Tyrian purple; pigments of non-biological organic: quinacridone, magenta, phthalo green, phthalo blue, pigment red 170; etc. As indicated above, in some instances the pigment component may be blended with the granular composition to produce the desired colored composition. In other instances, the pigment may be incorporated into the carbonate granules, e.g., by including the pigment in the composition that is subjected to elevated pressure and/or setting liquid, such as describe above. Additional pigments of interest further include, but are not limited to: PC-9415 Yellow, PC-9416 Yellow, PC-9158 Autumn Gold, PC-9189 Bright Golden Yellow, v-9186 Iron-Free Chestnut Brown, V-780 Black, V0797 IR Black, V-9248 Blue, PC-9250 Bright Blue, PC-5686 Turquoise, V-13810 Red, V-12600 Camouflage Green, V12560 IR Green, V-778 IR Black, and V-799 Black, carbon black, iron oxide, phthalocyanine, umber, chromium oxide, titanium oxide and cobalt blue, etc.).

In some instances, the non-carbonate additional pigments are solar reflective pigments, e.g., as described in U.S. Pat. Nos. 8,394,498; 8,491,985 and 8,535,803; the disclosures of which patents are herein incorporated by reference. In some instances, such solar reflective pigments are selected from the group consisting of solar reflective pigments having L* less than 30 and a solar reflectance of at least 20 percent. As used in the present specification L*, a* and b* refer to the parameters of the CIELAB color system. "Colored" means having an L* value 85 or less, such as 55 or less, including 45 or less, when measured using a HunterLab Model Labscan XE spectrophotometer using a 0 degree viewing angle, a 45 degree illumination angle, a 10 degree standard observer, and a D-65 illuminant. "Colored" as so defined is intended to include relatively dark tones. "Dark color" means a color having an L* value of 30 or less. "Solar reflective," and "Solar heat-reflective" refer to reflectance in the near infrared range (700 to 2500 nm) of the electromagnetic spectrum, and "high solar reflectance" means having an average reflectance of 70 percent or more over the near infrared range (700 to 2500 nm) of the electromagnetic spectrum.

In some instances, the granular composition may include an algae-resistance compound (i.e., an algaecide), e.g., where the algaecide component may be a distinct component mixed or combined with the granular carbonate pigments in a heterogeneous composition, or the algaecide component may be integral part of the granules of the granular composition, e.g., where the algaecide component is found either coated onto at least a portion of the surface of the carbonate pigment granules or found throughout the carbonate pigment granules (including the interior of the granules). Examples of algaecides of interest include, but are not limited to copper materials, zinc materials, and mixtures thereof. For example, cuprous oxide and/or zinc oxide, or a mixture thereof, can be used. The copper materials that can be used in the present invention include cuprous oxide, cupric acetate, cupric chloride, cupric nitrate, cupric oxide, cupric sulfate, cupric sulfide, cupric stearate, cupric cyanide, cuprous cyanide, cuprous stannate, cuprous thiocyanate, cupric silicate, cuprous chloride, cupric iodide, cupric bromide, cupric carbonate, cupric fluoroborate, and mixtures thereof. The zinc materials can include zinc oxide, such as French process zinc oxide, zinc sulfide, zinc borate, zinc sulfate, zinc pyrithione, zinc ricinoleate, zinc stearate, zinc chromate, and mixtures thereof. Also of interest are eluting organic materials.

In some instances, the granular composition may include a UV absorber, where the UV absorber component may be a distinct component mixed or combined with the granular carbonate pigments in a heterogeneous composition, or the UV absorber component may be integral part of the granules of the granular composition, e.g., where the UV absorber component is found either coated onto at least a portion of the surface of the carbonate pigment granules or found throughout the carbonate pigment granules (including the interior of the granules). As desired, the UV absorber may be present in an amount sufficient to absorb at least some of the UV light to which the product incorporated the pigment composition may be exposed, e.g., light having a wavelength ranging from 100 to 400 nm, reflected by the carbonate compounds of the carbonate pigment. UV absorbers of interest include, but are not limited to: benzotriazole type ultraviolet light absorbers, such as 2-[2-hydroxy-3,5-di-(1, 1-dimethylbenzyl)]-2H-benzotriazole (CAS#: 70321-86-7), a blend of α-[3-[3-(2H-Benotriazol-2-yl)-5-(1,1-dimethylethyl)-4-hydroxyphenyl]-1-oxopropyl]-ω-hydroxypoly (oxo-1,2-ethanediyl) [CAS #104810-48-2]+α-[3-[3-(2H-Benotriazol-2-yl)-5-(1,1-dimethylethyl)-4-hydroxyphenyl]-1-oxopropyl]-ω-[3-[3-(2H-benzotriazol-2-yl)-5-(1,1-dimethylethyl)-4-hydroxyphenyl]-1-oxopropoxy] poly(oxy-1,2-ethanediyl) [CAS #104810-47-1]+Polyethylene glycol 300 [CAS #25322-68-3, 2-(3'-tert-butyl-2'-hydroxy-5'-methylphenyl)-5-chlorobenzotriazole (CAS#: 3896-11-5), 2-(2'-Hydroxy-3', 5'-di-tert-amylphenyl) benzotriazole (CAS#: 25973-55-1), 2-(2H-Benzotriazole-2-yl)-4-methylphenyl (CAS#: 2440-22-4), and 2-(2-hydroxy-5-tert-octylphenyl) benzotriazole (CAS#: 3147-75-9); benzophenone UV absorbers, such as 2-Hydroxy-4-n-Octoxybenzophenone (CAS#: 1843-05-6), etc. When present, the amount of UV absorber in the pigment composition may range from 0% to 25%, such as 1% to 5%.

Other components that may be present in compositions that include a carbonate pigment composition of the invention include, but are not limited to: fillers, binders, sealants, polymers, other inorganic and organic compounds, etc., depending on the particular use of the carbonate white pigment composition.

Utility

Carbonate pigment compositions, e.g., as described herein, find use in a variety of different applications. Applications are varied, where applications of interest include, but are not limited to: coatings, such as paints, $TiO_2$ fillers, primers and other coating compositions; as cool pigments; roofing membranes; etc.

Coatings

Carbonate pigment compositions of the invention may be incorporated into liquid coating compositions, e.g., paints, primers and other coating materials, etc., for application to a surface of a substrate. Coating compositions of interest include an amount of a carbonate pigment composition as a first component and a vehicle component as a second component. Depending on the particular use of the coating composition, e.g., as a paint, the vehicle component may vary. For example, the vehicle component may include one or more of: binders, pigments; dyes; solvents; surface tension modifiers; rheology modifiers; stabilizers; binders; antifreeze property modifiers; foaming controllers; skinning controllers; thickeners; emulsifiers; texture modifiers; adhesion promoters; antioxidants; UV stabilizers; flatteners (deglossing agents); biocides; and other materials. The amount of the carbonate pigment component in the vehicle component may vary in the coating composition, and may be present in some instances at the CPVC value or a value less than the CPVC value. Coatings of interest include, but are not limited to: architectural paints (including both alkyd and latex paints), including interior architectural paints, e.g., gloss, semigloss paints and flat paints, etc., exterior architectural paints, etc.; industrial finishes, including but not limited to automotive finishes, aerospace coatings, powder coatings, coil and can coatings, and maintenance coatings; etc.

Roofing Membranes

Carbonate pigments, e.g., as described herein, also find use in roofing membranes. The term "roofing membrane" is employed in its conventional sense to refer to single-ply membranes that are flexible sheets of compounded synthetic materials that are configured for use in roofing applications. Roofing membranes of interest include thermoset, thermoplastic, and modified bitumen roofing membranes. Thermoset roofing membranes are made of large, flat pieces of synthetic rubber or similar materials, where the pieces are welded together at the seams to form one continuous membrane. Rubbers of interest include, but are not limited to: ethylene propylene diene monomer (EPDM), neoprene, etc. In thermoset roofing membranes, the seams are held together using suitable adhesives materials or tapes. Thermoplastic membranes are similar to thermoset membranes, where the seams are bonded melted or dissolved with heat or solvents, and can be as strong as the rest of the membrane. Thermoplastic membranes are based on elastomeric polymers that can be processed as plastics. Thermoplastic polyolefin (TPO) based roofing membranes may be a melt blend or reactor blend of a polyolefin plastic, such as a polypropylene polymer, with an olefin copolymer elastomer (OCE), such as an ethylene-30 propylene rubber (EPR) or an ethylene-propylene-diene rubber (EPDR). TPO-based roofing membranes may comprise one or more layers. A TPO membrane may comprise base-(bottom) and cap-(top) layers with a fiber reinforcement scrim (middle) sandwiched between the other two layers. The scrim may be a woven, nonwoven, or knitted fabric composed of continuous strands of material used for reinforcing or strengthening membranes. The scrim is generally the strongest layer in the composite. The fabric can contribute significantly to the tensile strength of the roofing membrane and provide for dimensional stability. In an example, the fabric reinforcement comprises a polyester yarn based scrim. Modified bitumen membranes are factory-fabricated layers of asphalt, "modified" using a rubber or plastic ingredient (e.g., APP (atactic polypropylene) and SBS (styrene butadiene styrene) for increased flexibility, and combined with reinforcement for added strength and stability. While a given roofing membrane's thickness may vary, in some instances the thickness ranges from 0.75 mm to 1.5 mm.

In roofing membranes of the invention, the carbonate pigment, e.g., as described above, may be incorporated into the one or more layers of the membrane and or provided in a surface coating of the membrane, e.g., a surface of the membrane (e.g., the skyward surface of the membrane which does not face the interior of the building to which the membrane is applied). The highly reflective material may be incorporated into the roofing membrane in a variety of formats, e.g., from particles to granules, e.g., as described above. In some instances, the highly reflective material is present as particles, e.g., as ultrafine particles having a mean particle size of 165 nm or less, such as between 125 to 150 nm or between 110 to 165 nm.

Examples of specific roofing membranes and related compositions into which the highly reflective materials of the invention may be incorporated, e.g., in place of or in addition to the $TiO_2$ component of such membranes and related compositions, include but are not limited to those described in United States Published Patent Application Nos. 20130130581; 20120288678; 20110256378; 20110223385; 20100255739; 20100197844; 20100151198; 20100120953; 20080277056; 20070295390; 20070295389; 20070185245; 20070054576; 20070054129; 20060280892; 20060199453; 20060197069; 20060157103; 20050282449; 20050261407; 20050257875; 20050250399; 20030207969; the disclosures of the roofing membranes and related compositions of these published applications being incorporated herein by reference.

Roofing Granules

One type of formed building material which may include highly reflective compositions of the invention is formed roofing materials, such as roof shingles, tiles, sheets, etc., where incorporation of the materials results may result in the material being a "cool" roofing material.

Roof shingles of interest may include a support component, e.g., made from metal, clay, concrete, wood, asphalt, limestone etc., which has on a surface thereof a highly reflective composition, e.g., as described above, where the composition may or may include one or more additional components, e.g., pigments, UV absorbers, etc. An example of roofing material, such as a roof shingle, according to an embodiment of the invention is provided in FIG. 1, which figure provides a schematic drawing of a roof shingle 10 according to one embodiment of the present invention. The roof shingle 10 includes at least one asphalt layer 12, such as a layer of bitumen or modified bitumen. Bitumen or modified bitumen can be composed of one or more asphalt layers 14 and one or more layers of a reinforcing material 16 such as, for example, polyester or fiberglass. The upper asphalt layer 12 includes at least one granular layer 18 including a plurality of carbonate granules or particles 20 (e.g., as described above) adhered to or embedded within a top surface of the asphalt layer 12. According to various embodiments, the carbonate particles have a solar reflectance ranging from 2% to 99% such that when applied to the reinforced asphalt layer 12 result in a roofing system having a solar reflectance of 30% or more, such as 45% or more. The particles may be white in color or pigmented (i.e., hued), and may range in size in some instances from 0.01 mm to 5 mm. In one embodiment, the particles 62 are of substantially the same particle size distribution. The roof shingle 10 including the asphalt layer may be produced using any convenient protocol, such as by passing a reinforcement material 16, such as fiberglass or polyester, through hot liquid asphalt, which impregnates and coats the reinforcement material 16. This coated strip is then run under a hopper which dispenses the carbonate particles 20 onto the upper surface of the hot asphalt coated strip to substantially fully cover the surface. This strip is then passed over a roller or drum to flatten the particles 20 and press them into the asphalt included in the reinforced asphalt layer 12. The roofing material can be provided in the form of individual shingles or sheets which can then be applied to any commercial, industrial low or steep slope roofing surface.

The roofing granules are, in some instances, carbonate pigment comprising granules, such as described above. For example, the granules may be pure white and/or cool carbonate pigment granules, or granules having a non-carbonate pigment core coated with a white and/or cool carbonate pigment, such as described above. In some embodiments, the highly reflective granules used in the roofing materials, e.g., as described above, can include a coating and/or a surface treatment. The granules can be coated and/or their surfaces treated for any number of reasons including dust control, to enhance and/or increase water repellency and to prevent various kinds of staining. Various compounds can be used to coat or treat the surface the granules described above according to the various embodiments of the present invention. These compounds include, but are not limited to the following: silanes, siloxanes, polysiloxanes, organo-siloxanes, silicates, organic silicates, silicone resins, acrylics, urethanes, polyurethanes, glycol ethers and mineral oil. Further details regarding suitable coatings are provided in paragraphs 20 to 23 of U.S. Published Patent Application No. 20110081537; the disclosure of which paragraphs is herein incorporated by reference.

Photovoltaic Devices

Aspects of the invention include photovoltaic devices having carbonate backsheets. Photovoltaic devices of the invention may vary, where examples of such devices include photovoltaic modules and photovoltaic shingles. Depending on the nature of the device, the device may include one or more components in addition to the solar cell and carbonate backsheet component. For example, additional components of photovoltaic modules of the invention may include a transparent top layer and an encapsulant layer that includes the one or more solar cells, e.g., with associated circuitry, such as conductor or bus ribbons, etc. Each of these components is now reviewed separately in greater detail.

Photovoltaic devices of the invention may exhibit improved efficiency, e.g., as compared to a control device that lacks a carbonate backsheet. While the magnitude of efficiency improvement relative to a suitable control may vary, in some instances the magnitude is 5% or greater, such as 10% or greater, including 20%, 25%, 50%, 75% and even 80% or greater. In some instances, the photovoltaic devices of the invention are cooler as compared to a control device that lacks a carbonate backsheet under analogous environmental, including operating, conditions. While the magnitude of the decreased temperature relative to a suitable control may vary, in some instances the magnitude is 1° or more, such as 2° or more, including 3° or more, e.g., 5° or more.

Carbonate backsheets as described herein are backsheets, e.g., photovoltaic module or solar shingle backsheets, that include at a layer of a carbonate material, e.g., made from carbonate pigment composition, such as described above, where the backsheets may or may not include layers of other non-carbonate materials, e.g., they may be multilayer backsheets.

The carbonate material that is present in the carbonate layer of the backsheet may vary. In some instances, the carbonate material is a highly reflective microcrystalline/amorphous carbonate material, such as described above. The microcrystalline/amorphous materials present in backsheets of the invention are those that are highly reflective. As the materials are highly reflective, the backsheets that include the same may have a high total surface reflectance (TSR) value. TSR may be determined using any convenient protocol, such as ASTM E1918 Standard Test Method for Measuring Solar Reflectance of Horizontal and Low-Sloped Surfaces in the Field (see also R. Levinson, H. Akbari, P. Berdahl, Measuring solar reflectance—Part II: review of practical methods, LBNL 2010). In some instances, the backsheets exhibit a TSR value ranging from $Rg;0=0.0$ to $Rg;0,=1.0$, such as $Rg;0,=0.25$ to $Rg;0,=0.99$, including $Rg;0,=0.40$ to $Rg;0,=0.98$, e.g., as measured using the protocol referenced above.

In some instances, the backsheets that include the carbonate materials are highly reflective of near infra-red (NIR) light, ranging in some instances from 30 to 99%, such as 10 to 99%, and including 50 to 99%. By NIR light is meant light having a wavelength ranging from 700 nanometers (nm) to 2.5 mm. NIR reflectance may be determined using any convenient protocol, such as ASTM C1371-04a(2010) e1 Standard Test Method for Determination of Emittance of Materials Near Room Temperature Using Portable Emissometers (http://www.astm.org/Standards/C1371.htm) or ASTM G173-03(2012) Standard Tables for Reference Solar Spectral Irradiances: Direct Normal and Hemispherical on 37° Tilted Surface (see website produced by placing "http://" before "rredc.nrel.gov/solar/spectra/am1.5/ASTMG173/ASTMG173.html"). In some instances, the backsheets exhibit a NIR reflectance value ranging from $Rg;0=0.0$ to $Rg;0=1.0$, such as $Rg;0=0.25$ to $Rg;0=0.99$, including $Rg;0=0.40$ to $Rg;0=0.98$, e.g., as measured using the protocol referenced above.

In some instances, the carbonate backsheets are highly reflective of ultra-violet (UV) light, ranging in some instances from 1 to 99%, such as 10 to 99%, and including 50 to 99%. By UV light is meant light having a wavelength ranging from 400 nm and 10 nm. UV reflectance may be determined using any convenient protocol, such as ASTM G173-03(2012) Standard Tables for Reference Solar Spectral Irradiances: Direct Normal and Hemispherical on 37° Tilted Surface. In some instances, the materials exhibit a UV value ranging from $Rg;0=0.0$ to $Rg;0=1.0$, such as $Rg;0=0.25$ to $Rg;0=0.99$, including $Rg;0=0.4$ to $Rg;0=0.98$, e.g., as measured using the protocol referenced above.

In some instances, the backsheets are reflective of visible light, e.g., where reflectivity of visible light may vary, ranging in some instances from 1 to 99%, such as 10 to 99%, and including 10 to 90%. By visible light is meant light having a wavelength ranging from 380 nm to 740 nm. Visible light reflectance properties may be determined using any convenient protocol, such as ASTM G173-03(2012) Standard Tables for Reference Solar Spectral Irradiances: Direct Normal and Hemispherical on 37° Tilted Surface. In some instances, the backsheets exhibit a visible light reflectance value ranging from $Rg;0=0.0$ to $Rg;0=1.0$, such as $Rg;0=0.25$ to $Rg;0=0.99$, including $Rg;0=0.4$ to $Rg;0=0.98$, e.g., as measured using the protocol referenced above.

The above reflectance properties of the materials may be determined using any convenient protocol, including the specific reflectance determination protocols described below.

The materials making up the carbonate component of the carbonate backsheets may be amorphous or microcrystalline. In some instances, the materials are microcrystalline. As the materials are microcrystalline, the crystal size, e.g., as determined using the Scherrer equation applied to the FWHM of X-ray diffraction pattern, is small, and in some instances is 1000 microns or less in diameter, such as 100 microns or less in diameter, and including 10 microns or less in diameter. In some instances, the crystal size ranges in diameter from 1000 μm to 0.001 μm, such as 10 to 0.001 μm, including 1 to 0.001 μm. In some instances, the crystal size is chosen in view of the wavelength(s) of light that are to be reflected. For example, where light in the visible spectrum is to be reflected, the crystal size range of the materials may be selected to be less than one-half the "to be reflected" range, so as to give rise to photonic band gap. For example, where the to be reflected wavelength range of light is 100 to 1000 nm, the crystal size of the material may be selected to be 50 nm or less, such as ranging from 1 to 50 nm, e.g., 5 to 25 nm. In some embodiments, the materials produced by methods of the invention may include rod-shaped crystals and amorphous solids. The rod-shaped crystals may vary in structure, and in certain embodiments have length to diameter ratio ranging from 500 to 1, such as 10 to 1. In certain embodiments, the length of the crystals ranges from 0.5 μm to 500 μm, such as from 5 μm to 100 μm. In yet other embodiments, substantially completely amorphous solids are produced.

The density, porosity, and permeability of the highly reflective materials may vary according to the application. With respect to density, while the density of the material may vary, in some instances the density ranges from 5 g/cm$^3$ to 0.01 g/cm$^3$, such as 3 g/cm$^3$ to 0.3 g/cm$^3$ and including 2.7 g/cm$^3$ to 0.4 g/cm$^3$. With respect to porosity, as determined by Gas Surface Adsorption as determined by the BET method (Brunauer Emmett Teller (e.g., as described at http://en.wikipedia.org/wiki/BET_theory, S. Brunauer, P. H. Emmett and E. Teller, J. Am. Chem. Soc., 1938, 60, 309. doi:10.1021/ja01269a023) the porosity may range in some instances from 100 m$^2$/g to 0.1 m$^2$/g, such as 60 m$^2$/g to 1 m$^2$/g and including 40 m$^2$/g to 1.5 m$^2$/g. With respect to permeability, in some instances the permeability of the material may range from 0.1 to 100 darcies, such as 1 to 10 darcies, including 1 to 5 darcies (e.g., as determined using the protocol described in H. Darcy, Les Fontaines Publiques de la Ville de Dijon, Dalmont, Paris (1856).). Permeability may also be characterized by evaluating water absorption of the material. As determined by water absorption protocol, e.g., the water absorption of the material ranges, in some embodiments, from 0 to 25%, such as 1 to 15% and including from 2 to 9%.

The hardness of the materials may also vary. In some instances, the materials exhibit a Mohs hardness of 3 or greater, such as 5 or greater, including 6 or greater, where the hardness ranges in some instances from 3 to 8, such as 4 to 7 and including 5 to 6 Mohs (e.g., as determined using the protocol described in American Federation of Mineralogical Societies. "Mohs Scale of Mineral Hardness"). Hardness may also be represented in terms of tensile strength, e.g., as determined using the protocol described in ASTM C1167. In some such instances, the material may exhibit a compressive strength of 100 to 3000 N, such as 400 to 2000 N, including 500 to 1800 N.

As reviewed above, carbonate backsheets of the invention include one or more carbonate materials, such as described above. By carbonate material is meant a material or composition that includes one or more carbonate compounds, such as two or more different carbonate compounds, e.g., three or more different carbonate compounds, five or more different carbonate compounds, etc., including non-distinct, amorphous carbonate compounds. Carbonate compounds of interest may be compounds having a molecular formulation $X_m(CO_3)_n$ where X is any element or combination of elements that can chemically bond with a carbonate group or its multiple, wherein X is in certain embodiments an alkaline earth metal and not an alkali metal; wherein m and n are stoichiometric positive integers. These carbonate compounds may have a molecular formula of $X_m(CO_3)_n \cdot H_2O$, where there are one or more structural waters in the molecular formula. The amount of carbonate in the carbonate compounds of the carbonate material, as determined by coulometry using the protocol described as coulometric titration, may be 40% or higher, such as 70% or higher, including 80% or higher. In some embodiments, carbonate compounds of interest are those having a reflectance value across the visible spectrum of 0.5 or greater, such as 0.6 or greater, 0.7 or greater, 0.8 or greater, 0.9 or greater, including 0.95 or greater. In some instances, carbonate compounds have a lower visible reflectance, e.g., 0.5 or lower, such as 0.4 or lower, including 0.2 or lower, e.g., 0.1 or lower, 0.5 or lower, such as dark colored carbonates, where such carbonates may still have a high IR reflectance, e.g., as described above.

The carbonate compounds may include a number of different cations, such as but not limited to ionic species of: calcium, magnesium, sodium, potassium, manganese, cobalt, zinc, copper, iron, nickel, sulfur, boron, silicon, strontium, and combinations thereof. Of interest are carbonate compounds of divalent metal cations, such as calcium, magnesium, manganese, cobalt, zinc, copper, iron and nickel carbonate compounds. Specific carbonates of interest: calcium carbonates, magnesium carbonates, manganese carbonates, cobalt carbonates, zinc carbonates, copper carbonates, iron carbonates, nickel carbonates, and combinations of different metal carbonates (such as infrared reflective carbonate pigments that can be used as colored backsheets, e.g., $(Ca,Fe)CO_3$, $(Ni, Cu)CO_3$, $(Mn, Fe, Ca)CO_3$, $(Ca, Mn, Co, Fe, Zn, Cu, Ni)CO_3$, and the like. Specific carbonate compounds of interest include, but are not limited to: calcium carbonate minerals, magnesium carbonate minerals and calcium magnesium carbonate minerals, e.g., as described above, including $CO_2$ sequestering compounds, such as described above.

In some instances, the carbonate layers of the carbonate backsheets may include one or more modifying components. In some instances, modifying components are color imparting components. Many different color imparting components may be incorporated into the carbonate compound(s) and/or provided in the carbonate material layer of the backsheets in addition to the carbonate compound(s). Color imparting components include color modifiers. For example, the highly reflective materials may be produced using a color modifier(s) which modifies the color of the final material in some desirable way. Examples of such modifiers include, but are not limited to, ions which substitute into the carbonate mineral of the carbonate compositions, such as transition metals, e.g., copper, etc., as may be provided by precipitating carbonates from transition metal precursors, such as transition metal chlorides. Examples of such ions include, but are not limited to: manganese, iron, copper, nickel, chromium, cobalt, zinc, etc. When such modifiers are employed, the highly reflective materials may have a visible color that varies, including but not limited to: red, blue, green, yellow, orange, brown, black, etc. Color imparting components that may be present in the carbonate material layer include pigments. Pigments of interest include, but are not limited to: metal based pigments, e.g., Cadmium pigments: cadmium yellow, cadmium red, cadmium green, cadmium orange, cadmium sulfoselenide; Chromium pigments: chrome yellow and chrome green; Cobalt pigments: cobalt violet, cobalt blue, cerulean blue, aureolin (cobalt yellow); Copper pigments: Azurite, Han purple, Han blue, Egyptian blue, Malachite, Paris green, Phthalocyanine Blue BN, Phthalocyanine Green G, verdigris, viridian; Iron oxide pigments: sanguine, caput mortuum, oxide red, red ochre, Venetian red, Prussian blue; Lead pigments: lead white, cremnitz white, Naples yellow, red lead; Manganese pigments: manganese violet; Mercury pigments: vermilion; Titanium pigments: titanium yellow, titanium beige, titanium white, titanium black and Zinc pigments: zinc white, zinc ferrite; inorganic pigments, such as Carbon pigments: carbon black (including vine black, lamp black), ivory black (bone char); Clay earth pigments (iron oxides): yellow ochre, raw sienna, burnt sienna, raw umber, burnt umber; Ultramarine pigments: ultramarine, ultramarine green shade; biological and organic pigments, e.g., pigments of biological origin: alizarin (synthesized), alizarin crimson (synthesized), gamboge, cochineal red, rose madder, indigo, Indian yellow, Tyrian purple; pigments of non-biological organic: quinacridone, magenta, phthalo green, phthalo blue, pigment red 170; etc.

A given carbonate layer of a backsheet may be made up of just the highly reflective carbonate material, e.g., including a white and/or cool carbonate pigment, such as described above, or include one or more additional compositions, such as but not limited to binders, UV absorbers, biocides, fillers, sealants, polymers, other inorganic and organic compounds, etc.

In some instances, the carbonate backsheet includes white carbonate pigment materials, e.g., as described in U.S. Application Ser. No. 62/044,037 and/or cool carbonate pigment materials, e.g., as described in U.S. Provisional Patent Application No. 62/044,040, the disclosures of which applications are herein incorporated by reference.

The thickness of the carbonate layer may vary, as desired. In some instances, the thickness may range from 0.1 μm to 10 mm, such as 1 μm to 1000 μm, including 10 μm to 500 μm.

As reviewed above, the carbonate backsheet may be made up solely of a carbonate material layer, or may include one or more additional layers of material, as desired, such that the carbonate backsheet is a multi-layer carbonate backsheet. As such, the carbonate backsheet may be a laminate of a carbonate layer and an additional layer of a material that is different from the carbonate layer. Where one or more additional layers are present, these additional layers may vary widely in terms of composition, thickness, color, etc., as desired. Non-limiting examples of such materials are fluoropolymers, including but not limited to polyvinyl fluoride (PVF), polyvinylidene fluoride (PVDF), ethylene-terafluoethylene (ETFE), fluorinated ethylene-propylene (FEP), perfluoroalkoxy (PFA), ethylene chlorotrifluoroethylene (ECTFE) and polychlorotrifluoroethane (PCTFE; commercially available from Honeywell for example). Other materials that may be used in addition to or instead of a fluoropolymer, including silicone polyesters, chlorine-containing materials such as polyvinyl chloride (PVC), plastisols, ethylene vinyl acetate (EVA), linear low-density polyethylene (LLDPE), acrylics and polyimides (commercially available from DuPont for example). The one or more additional layers of the multi-layer backsheet embodiments may therefore be made of different materials. See e.g., U.S. Pat. Nos. 7,829,783; 8,062,744 and 7,985,919. When one or more additional layers are present, such layers may be positioned on the surface of the carbonate layer that does not face the encapsulant of the photovoltaic module, such that the carbonate layer is positioned between the encapsulant component of the module and the one or more additional layers. The thickness of the one or more additional layers may vary, as desired, ranging in some instances from 0.1 μm to 100 mm, such as 1 μm to 10 mm, including 10 μm to 500 mm.

In addition to the carbonate backsheet, photovoltaic devices of the invention further include one or more photovoltaic cells. The photovoltaic cells may be any convenient photovoltaic cells. Photovoltaic cells may be wafer-based crystalline silicon photovoltaic cells or thin-film photovoltaic cells based on cadmium telluride or silicon. Photovoltaic cells are commercially available from many sources. Non-limiting examples of companies that sell photovoltaic cells are Suntech, First Solar, Sharp Solar, Yingli, Trina Solar, Canadian Solar, Hanwha Solarone, Sunpower, Renewable Energy Corporation and Solarworld.

One type of photovoltaic device of interest is a photovoltaic module. In addition to the photovoltaic cell and carbonate backsheet components, e.g., as described above, such devices may further include a transparent Top Layer and an encapsulant layer, e.g., as described below.

The transparent top layer of the present invention may be made of any suitable material, which materials include plastics and glasses. Non-limiting examples of suitable plastic materials include polychlorotrifluoroethylene (PCTFE), ethylene chlorotrifluoroethylene (ECTFE), ethylene tetrafluoroethylene (ETFE), fluorinated ethylene propylene (FEP), polytetrafluoroethylene (PTFE), and/or other low-haze, optically clear, moisture permeation resistant barrier plastic films, e.g., with long-term opacity in the ultraviolet (UV) spectrum, light-trapping surface geometry, and of a thickness from about 20 μm to 500 μm.

As summarized above, in addition to the top layer and carbonate backsheet, photovoltaic modules described herein may also include an encapsulant layer. Encapsulant layers found in photovoltaic modules of the invention include at least one encapsulant-embedded photovoltaic cell disposed between the transparent top layer and the carbonate backsheet. The term encapsulant as used herein refers to any material suitable for embedding photovoltaic cells in photovoltaic modules. Non-limiting examples of such materials include highly transparent, electrically insulating resins, such as ethylene vinyl acetate (EVA) or polyvinyl butyral (PVB), or moisture permeation resistant epoxy resins, such as bisphenol-A cured with polyamine, polyamide, amidoamine, or cycloaliphatic amines inclusive of all modified versions of these resins and other common solar module encapsulants. See, e.g., U.S. Pat. Nos. 7,829,783 and 7,985,919.

The photovoltaic cells may present in the encapsulant layer may be any convenient photovoltaic cells. Photovoltaic cells may be wafer-based crystalline silicon photovoltaic cells or thin-film photovoltaic cells based on cadmium telluride or silicon. Photovoltaic cells are commercially available from many sources. Non-limiting examples of companies that sell photovoltaic cells are Suntech, First Solar, Sharp Solar, Yingli, Trina Solar, Canadian Solar, Hanwha Solarone, Sunpower, Renewable Energy Corporation and Solarworld.

Figure 2:
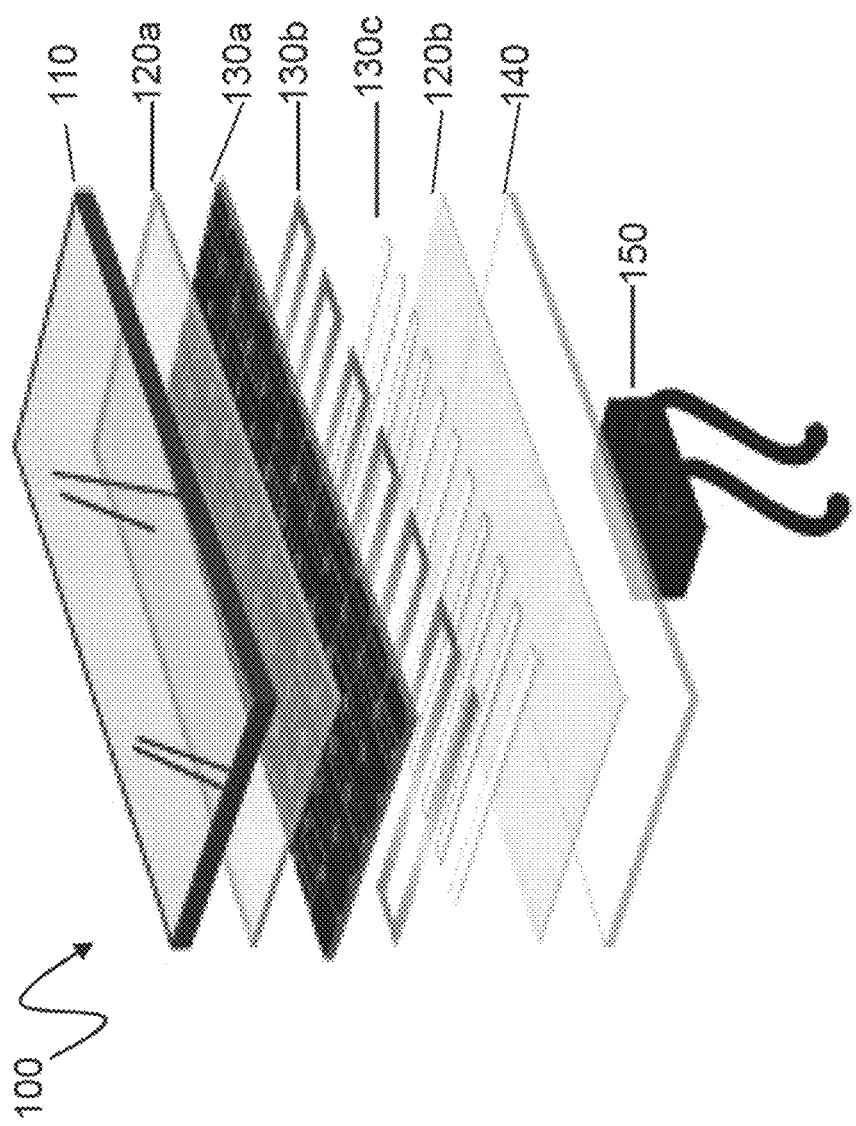
FIG. 2 provides an exploded view of an embodiment of a photovoltaic module in accordance with the invention.

FIG. 2 provides an exploded view of an embodiment of a photovoltaic module in accordance with the invention. As shown in FIG. 2, photovoltaic module 100 includes a transparent top layer 110, e.g., made of a glass. Also shown is carbonate backsheet 140. Positioned between the carbonate backsheet 140 is an encapsulant layer made up of upper and lower layers of EVA (120a and 120b) and a set of photovoltaic cells 130a along with accompanying bus ribbons 130b and EPE insulation 130c. Also shown is junction box 150 which serves as the interface between the bus ribbons and the DC input and output cables.

Any convenient photovoltaic module manufacturing protocol may be employed to make photovoltaic modules of the invention. The manufacture of photovoltaic cells, photovoltaic modules and backsheets is well known to those skilled in the art. See, e.g., Augustin McEvoy et al., Practical Handbook of Photovoltaics—Fundamentals and Applications, Academic Press, 1.sup.st Edition, 2011; and G. N. Tiwari and Swapnil Dubey, Fundamentals of Photovoltaic Modules and their Applications, RSC Publishing, 2010.

The carbonate backsheet may be produced using any convenient protocol. Protocols for producing formed object from carbonate materials are described in: U.S. patent application Ser. No. 14/112,495 published as United States Patent Application Publication No. 2014/0234946 and U.S. patent application Ser. No. 14/214,129 published as United States Patent Application Publication No. 2014/0271440; the disclosures of which are herein incorporated by reference. In addition, carbonate material coating protocols may be employed, e.g., as described in U.S. Provisional Patent Application Ser. Nos. 61/947,372 and 62/062,084; the disclosures of which application are herein incorporated by reference.

Photovoltaic devices, e.g., modules and shingles, as described herein find use in converting light to electricity. Of interest are applications where the light is sunlight. In such methods, the photovoltaic module is exposed to the sunlight in a manner such that it produces electricity, which product electricity is then used as desired. Aspects of the methods may include stably associated the photovoltaic module with a structure. Structures with which a photovoltaic module may be associated may vary, where such structures includes buildings, which may be commercial or residential, and displays configured to position the module in a desired orientation relative to a light source, e.g., the sun.

The following examples are offered by way of illustration and not by way of limitation.

EXPERIMENTAL

I. White Carbonate Pigments
A. Materials and Methods
1. Calcium Carbonate Precipitation General reaction: $MCl_2 + 2NaHCO_3 \rightarrow MCO_3 + CO_2 + H_2O + 2NaCl$ (M=different combinations of Ca and Mg)

Bicarbonate ($NaHCO_3$) solution was slowly added to metal chloride solutions (dual decomposition) containing different mixtures of Ca and Mg according to the reactions in following table. For vaterite synthesis, bicarbonate solutions were mixed with sodium sulfate ($Na_2SO_4$) to induce vaterite synthesis. The precipitated carbonates were settled for 30 minutes and filtered through 0.45 μm filter, and dried for 7 days at ambient condition.

| Types of $CaCO_3$ | Reaction process |
|---|---|
| Calcite | (8 L: 1M CaCl2) + (8 L: 1M NaHCO3) stirred for 1 hour |
| Vaterite | (56 L: 0.13M CaCl2 + 0.05M MgCl2) + (28 L: 0.18M NaHCO3 + 0.05M Na2SO4) stirred for 1 hour |
| Amorphous calcium carbonate (ACC) | (42 L: 0.15M CaCl2 + 0.6M MgCl2) + (42 L: 0.75M NaHCO3) stirred for 1 hour |
| Aragonite | (42 L: 0.15M CaCl2 + 0.6M MgCl2) + (42 L: 0.75M NaHCO3) stirred for 1 hour and settled overnight and then fully dried |

2. Solar Reflectance Sample Preparation and Measurements
a. Pigment Sample Preparation for Solar Reflectance Measurement The powdered pigments were compacted as pellets to obtain a smoothed surface for solar reflectance collection. 5 g of pigment samples were compressed in a cylinder-shaped die and inserted into Carver Presser. The pigments were compressed at 10,000 lbf for 5 minutes and taken out as thin pellet samples. The pellet samples were loaded on Lambda 950 to obtain solar reflectance spectra.

b. Solar Reflectance Analysis

Solar reflectance spectra were collected using Perkin-Elmer Lambda 950 UV-Vis-NIR spectrometer loaded with 150 mm Integrating Sphere. The data were recorded using UV Winlab 6.0.2 software with 5 nm intervals. The solar reflectance was calculated based on clear sky Air Mass 1 Global Horizontal (AM1GH) and ASTM Standard E892-87 terrestrial solar irradiance to compute solar (averaged over range, 300-2500 nm), UV (averaged over range, 300-400 nm), visible (averaged over range, 400-700 nm), and near-infrared (averaged over range, 700-2500 nm) reflectance.

3. Transmittance Sample Preparation and Measurement 0.4 g of pulverized pigments were mixed thoroughly with 2 g of Titebond II Premium Wood Glue. On a microscope glass that has been cleaned and sonicated with ethanol, the pigment-glue mixture was uniformly applied using 105 μm-thick tapes (Scotch Masking Tape). When the microscope thin film coatings were fully dry, the masking tapes were removed for transmittance measurements.

Transmittance spectra were collected using Perkin-Elmer Lambda 950 UV-Vis-NIR spectrometer loaded with 150 mm Integrating Sphere. The data were recorded using UV Winlab 6.0.2 software with 1 nm intervals. The background spectrum was collected using a microscope glass with 2 g Titebond glue coated film. The transmittance values were calculated by averaging over 400-700 nm range (visible range).

4. CIELAB Color Coordinate Calculations

CIELAB color coordinates were calculated from solar reflectance data using ASTM standard E308 CIE Standard Illuminants and Responses (2 deg and 10 deg), developed from Lawrence Berkeley National Laboratory. R Studio software was used for immediate calculations.

B. Results

| sample | solar reflectance (200-2500 nm) | UV (300-400 nm) | visible (400-700 nm) | NIR (700-2500 nm) | ΔT (° C.) | L* | a* | b* | Transmittance (%) at 105 μm thickness |
|---|---|---|---|---|---|---|---|---|---|
| calcite | 0.95 | 0.85 | 0.95 | 0.96 | 0 | 98 | 0 | 1 | 47.8 |
| vaterite | 0.91 | 0.85 | 0.92 | 0.92 | 1.6 | 97 | 0 | 3 | 35.9 |
| aragonite | 0.87 | 0.83 | 0.92 | 0.82 | 4.2 | 97 | 0 | 2 | 56.3 |
| ACC | 0.89 | 0.75 | 0.91 | 0.89 | 2.9 | 97 | 1 | 3 | 55.4 |
| TiO2 (Aqua Solutions) | 0.87 | 0.66 | 0.94 | 0.83 | 4.2 | 98 | 0 | 1 | 5.1 |

Figure 3:
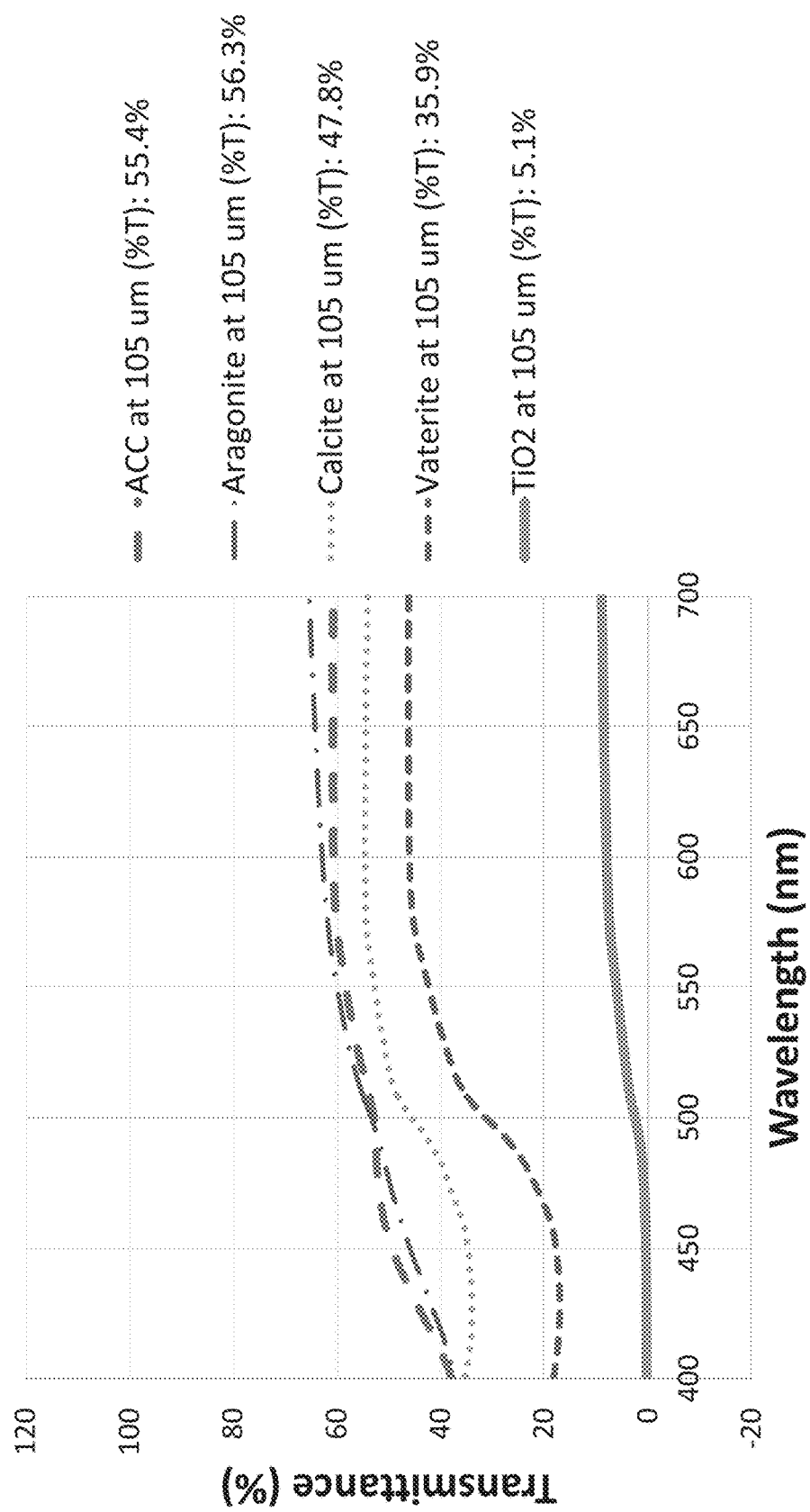
FIG. 3 provides the results of a transmittance assay employing a synthesized calcium carbonate pigment (calcite and vaterite) compositions according to an embodiment of the invention, as described in greater detail below in the experimental section.
Figure 4:
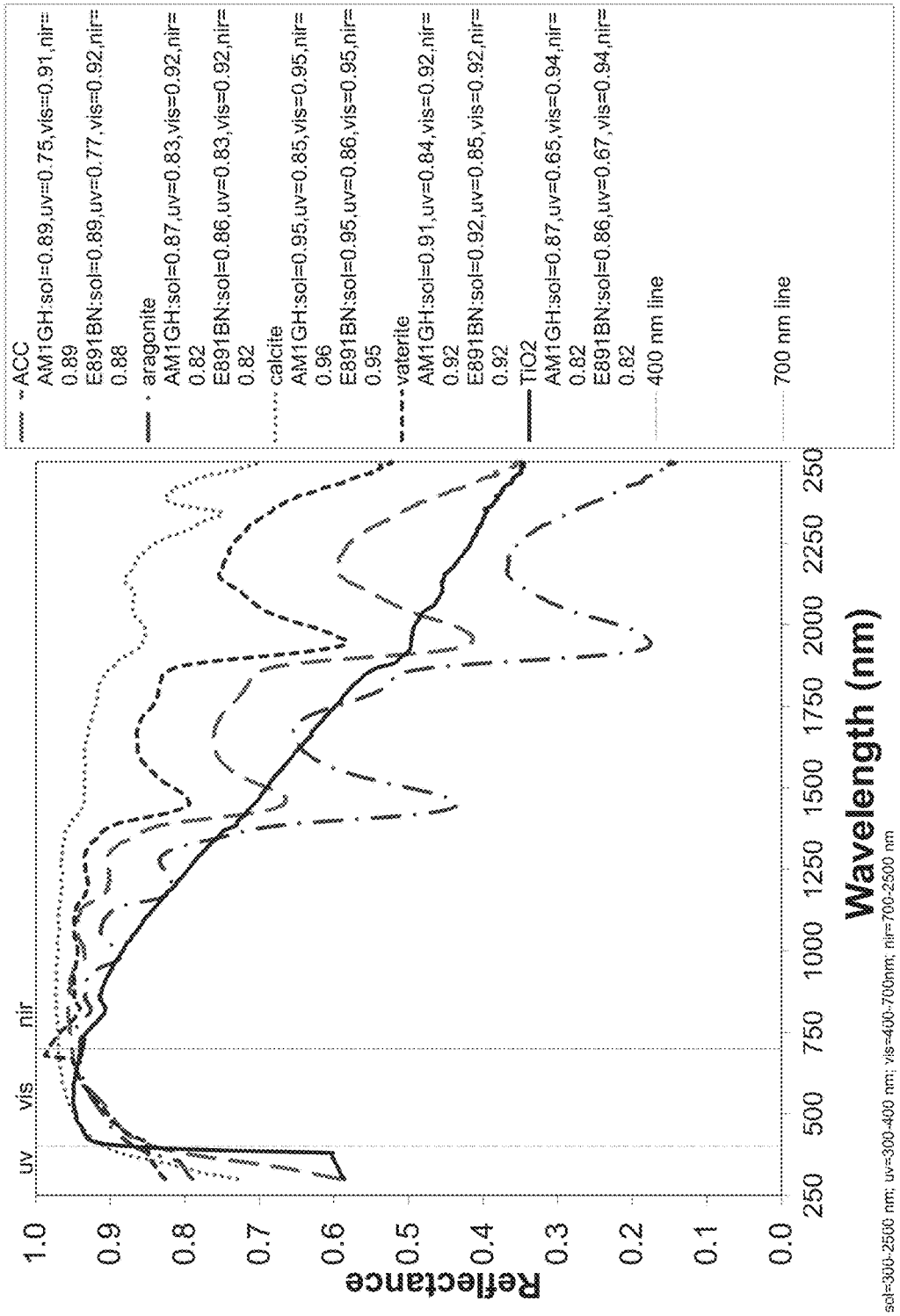
FIG. 4 provides the results of solar reflectance spectrum of synthesized calcium carbonate (calcite) compared with $TiO_2$.

Additional results are provided in FIGS. 3 and 4.

II. Cool Carbonate Pigments
A. Materials and Methods
1. Precipitation
a. Neutral pH Precipitation General reaction: $MCl_2 + 2NaHCO_3 \rightarrow MCO_3 + CO_2 + H_2O + 2NaCl$ (M=different combinations of Ca, Mn, Fe, Ni, Cu, Co, Zn)

b. Basic pH Precipitation $MCl_2 + Na_2CO_3 \rightarrow MCO_3 + 2NaCl$ (M=different combinations of Ca, Mn, Fe, Ni, Cu, Co, Zn)

Carbonate ($NaHCO_3$ or $Na_2CO_3$) solutions were slowly added to metal chloride solutions (dual decomposition) containing different mixtures of Ca, Mn, Fe, Ni, Cu, Co, and Zn according to the reactions in following table. The precipitated pigments were filtered through 0.45 μm filter, and dried for 7 days at ambient condition. The dried pigments were pulverized with a mortar and a pestle to reduce the average particle sizes.

c. Reactions surface of white compressed pellets. 0.2 to 5 g of pigments were added to 20 g of $CaCO_3$ powders. The mixed powders were compressed at 20,000 lbf for 30 minutes and set for 7

| Rxn # | Reaction process |
|---|---|
| 31 | (1 L: 0.45M $CaCl_2$ + 0.05M $MnCl_2$) + (1 L: 1M $NaHCO_3$) stirred for 1 hour |
| 32 | (1 L: 0.5M $MnCl_2$) + (1 L: 1M $NaHCO_3$) stirred for 1 hour |
| 33 | (1 L: 0.45M $CaCl_2$ + 0.05M $CuCl_2$) + (1 L: 1M $NaHCO_3$) stirred for 1 hour |
| 34 | (1 L: 0.5M $CuCl_2$) + (1 L: 1M $NaHCO_3$) stirred for 1 hour |
| 68 | 200 ml (1.57M $CuCl_2$) + 200 ml (1M $Na_2CO3$) stirred for 13 days settled for 2 days |
| 70 | 250 ml (1M $Na_2CO_3$) + 2.5 ml (1.57M $CuCl_2$) stirred for 5 minutes |
| 71 | 250 ml (0.5M $CaCl_2$ + 0.5M $MnCl_2$) + 250 ml (0.5M $Na_2CO_3$) stirred for 1 hour dried at 105° C. in the oven |
| 72 | 100 ml (0.6M $CoCl_2$) + 400 ml (0.6M $NaHCO_3$) stirred for 1 hour |
| 73 | 250 ml (0.5M $NiCl_2$) + 250 ml (0.5M $NaHCO_3$) stirred for one hour |
| 74 | 250 ml (0.05M $CoCl_2$) + 250 ml (0.05M $Na_2CO_3$) stirred for one hour |
| 75 | 250 ml (0.5M $ZnCl_2$) + 250 ml (0.5M $NaHCO_3$) stirred for one hour |
| 76 | 100 ml (0.375M $CuCl_2$ + 1.125M $ZnCl_2$) + 1 L (0.2M $NaHCO_3$) stirred for overnight |
| 86 | 250 ml (0.5M $FeCl_2$) + 250 ml (0.5M $NaHCO_3$) stirred for overnight |
| 87 | 250 ml (0.05M $FeCl_2$) + 250 ml (0.05M $Na_2CO_3$) stirred for one hour |
| 94 | 250 ml (0.5M $MnCl_2$) + 250 ml (0.5M $Na_2CO_3$) stirred for 90 min |
| 98 | 250 ml (0.5M $NiCl_2$) + 250 ml (0.5M $Na_2CO_3$) stirred for 5 days |
| 103 | 250 ml (0.333M $CoCl_2$ + 0.167M $CuCl_2$) + 250 ml (1M $NaHCO_3$) stirred for 1 hour |
| 104 | 250 ml (0.25M $CoCl_2$ + O.25M $CuCl_2$) + 250 ml (1M $NaHCO_3$) stirred for 30 min |
| 105 | 250 ml (0.25M $CoCl_2$ + O.25M $FeCl_2$) + 250 ml (1M $NaHCO_3$) stirred for 1 hour |
| 106 | 250 ml (0.25M $CoCl_2$ + O.25M $MnCl_2$) + 250 ml (1M $NaHCO_3$) stirred for 1 hour |
| 107 | 250 ml (0.25M $CoCl_2$ + O.25M $NiCl_2$) + 250 ml (1M $NaHCO_3$) stirred for 1 hour |
| 111 | 250 ml (0.25M $FeCl_2$ + O.25M $MnCl_2$) + 250 ml (1M $NaHCO_3$) stirred for 2 hours |
| 112 | 250 ml (0.1M $FeCl_2$ + O.4M $NiCl_2$) + 250 ml (1M $NaHCO_3$) stirred for 3 days |
| 113 | 250 ml (0.25M $MnCl_2$ + O.25M $NiCl_2$) + 250 ml (1M $Na_2CO_3$) stirred overnight |
| 114 | 250 ml (0.33M $CoCl_2$ + O.33M $CuCl_2$ + 0.33M $FeCl_2$) + 250 ml (1M $Na_2CO_3$) stirred overnight |
| 115 | 250 ml (0.33M $CoCl_2$ + O.33M $CuCl_2$ + 0.33M $MnCl_2$) + 250 ml (1M $Na_2CO_3$) stirred overnight |
| 116 | 250 ml (0.33M $CoCl_2$ + O.33M $CuCl_2$ + 0.33M $NiCl_2$) + 250 ml (1M $Na_2CO_3$) stirred overnight |
| 117 | 250 ml (0.33M $CoCl_2$ + O.33M $FeCl_2$ + 0.33M $MnCl_2$) + 250 ml (1M $Na_2CO_3$) stirred for 1 day |
| 118 | 250 ml (0.33M $CoCl_2$ + O.33M $FeCl_2$ + 0.33M $NiCl_2$) + 250 ml (1M $Na_2CO_3$) stirred for 1 day |
| 119 | 250 ml (0.25M $CuCl_2$ + O.25M $FeCl_2$) + 250 ml (1M $NaHCO_3$) stirred for 1 hour |
| 120 | 250 ml (0.25M $CuCl_2$ + O.25M $MnCl_2$) + 250 ml (1M $NaHCO_3$) stirred for 1 hour |
| 121 | 250 ml (0.25M $CuCl_2$ + O.25M $NiCl_2$) + 250 ml (1M $NaHCO_3$) stirred for 1 hour |
| 122 | 250 ml (0.33M $CoCl_2$ + O.33M $NiCl_2$ + 0.33M $MnCl_2$) + 250 ml (1M $Na_2CO_3$) stirred for 1 day |
| 123 | 250 ml (0.33M $CuCl_2$ + O.33M $FeCl_2$ + 0.33M $MnCl_2$) + 250 ml (1M $Na_2CO_3$) stirred for 1 day |
| 124 | 250 ml (0.33M $CuCl_2$ + O.33M $NiCl_2$ + 0.33M $MnCl_2$) + 250 ml (1M $Na_2CO_3$) stirred for 1 hour |
| 125 | 250 ml (0.33M $CuCl_2$ + O.33M $FeCl_2$ + 0.33M $NiCl_2$) + 250 ml (1M $Na_2CO_3$) stirred for 3 days |
| 126 | 250 ml (0.33M $MnCl_2$ + O.33M $FeCl_2$ + 0.33M $NiCl_2$) + 250 ml (1M $Na_2CO_3$) stirred for 3 days |
| 127 | 250 ml (0.25M $CoCl_2$ + 0.25M $CuCl_2$ + 0.25M $FeCl_2$ + 0.25M $MnCl_2$) + 250 ml (1M $Na_2CO_3$) stirred for 1 day |
| 128 | 250 ml (0.25M $CoCl_2$ + 0.25M $CuCl_2$ + 0.25M $FeCl_2$ + 0.25M $NiCl_2$) + 250 ml (1M $Na_2CO_3$) stirred for 1 day |
| 129 | 250 ml (0.25M $CoCl_2$ + 0.25M $CuCl_2$ + 0.25M $MnCl_2$ + 0.25M $NiCl_2$) + 250 ml (1M $Na_2CO_3$) stirred for 1 day |
| 130 | 250 ml (0.25M $CoCl_2$ + 0.25M $MnCl_2$ + 0.25M $FeCl_2$ + 0.25M $NiCl_2$) + 250 ml (1M $Na_2CO_3$) stirred for 1 day |
| 131 | 250 ml (0.25M $CuCl_2$ + 0.25M $MnCl_2$ + 0.25M $FeCl_2$ + 0.25M $NiCl_2$) + 250 ml (1M $NaHCO_3$) stirred for 1 day |
| 132 | 250 ml (0.1M $CoCl_2$ + 0.1M $CuCl_2$ + 0.1M $FeCl_2$ + 0.1M $MnCl_2$ + 0.1M $NiCl_2$) + 250 ml (1M $NaHCO3$) stirred for 1 day |
| 135 | 250 ml (0.5M $FeCl_3$) + 250 ml (1M $NaHCO_3$) stirred for 1 week |
| 136 | 250 ml (0.3M $CoCl_2$ + 0.15M $CuCl_2$ + 0.05M $CaCl_2$) + 250 ml (1M $NaHCO_3$) stirred for 2 hours |
| 137 | 250 ml (0.22M $CoCl_2$ + 0.22M $CuCl_2$ + 0.06M $ZnCl_2$) + 250 ml (1M $NaHCO_3$) stirred for 2 hours |
| 138 | 250 ml (0.333M $CoCl_2$ + 0.167M $CuCl_2$) + 250 ml (1M $Na_2CO_3$) stirred for 1 hour |
| 139 | 250 ml (0.25M $CoCl_2$ + 0.25M $MnCl_2$) + 250 ml (1M $Na_2CO_3$) stirred for 1 hour |

2. Solar Reflectance Sample Preparation and Measurements a. Pigment Sample Preparation for Solar Reflectance Measurement The powdered pigments were compacted as pellets to obtain a smoothed surface for solar reflectance collection. 5 g of pigment samples were compressed in a cylinder-shaped die and inserted into Carver Presser. The pigments were compressed at 10,000 lbf for 5 minutes and taken out as thin pellet samples. The pellet samples were loaded on Lambda 950 to obtain solar reflectance spectra.

b. Pigmented $CaCO_3$ Pellet Preparation for Solar Reflectance Measurement

Pigments were applied on pellets by mixing with $CaCO_3$ powders before pellet compression, or by coating on the surface of white compressed pellets. 0.2 to 5 g of pigments were added to 20 g of $CaCO_3$ powders. The mixed powders were compressed at 20,000 lbf for 30 minutes and set for 7 days in the humidity chamber maintained at 40° C. The set pellets were cured in 1M $Na_2CO_3$ for 12 days. After drying the pellets for one week, solar reflectance measurements were conducted on the pigmented pellets.

Pigment coatings were applied by several drops of precipitates on the surfaces of white $CaCO_3$ pellet using transfer pipettes. Pigments were also coated by submerging white $CaCO_3$ pellets into pigment solutions, or by paint-brushing 0.4 g pigment+2 g glue mixture on white $CaCO_3$ pellet. All the samples were compared on solar reflectance measurements.

c. Solar Reflectance Analysis

Solar reflectance spectra were collected using Perkin-Elmer Lambda 950 UV-Vis-NIR spectrometer loaded with 150 mm Integrating Sphere. The data were recorded using UV Winlab 6.0.2 software with 5 nm intervals. The solar reflectance was calculated based on clear sky Air Mass 1 Global Horizontal (AM1GH) and ASTM Standard E892-87 terrestrial solar irradiance to compute solar (averaged over range, 300-2500 nm), UV (averaged over range, 300-400 nm), visible (averaged over range, 400-700 nm), and near-infrared (averaged over range, 700-2500 nm) reflectance.

3. Transmittance Sample Preparation and Measurement 0.4 g of pulverized pigments were mixed thoroughly with 2 g of Titebond II Premium Wood Glue. On a microscope glass that has been cleaned and sonicated with ethanol, the pigment-glue mixture was uniformly applied using 105 μm-thick tapes (Scotch Masking Tape). When the microscope thin film coatings were fully dry, the masking tapes were removed for transmittance measurements.

Transmittance spectra were collected using Perkin-Elmer Lambda 950 UV-Vis-NIR spectrometer loaded with 150 mm Integrating Sphere. The data were recorded using UV Winlab 6.0.2 software with 1 nm intervals. The background spectrum was collected using a microscope glass with 2 g Titebond glue coated film. The transmittance values were calculated by averaging over 400-700 nm range (visible range).

4. CIELAB Color Coordinate Calculations

CIELAB color coordinates were calculated from solar reflectance data using ASTM standard E308 CIE Standard Illuminants and Responses (2 deg and 10 deg), developed from Lawrence Berkeley National Laboratory. R Studio software was used for immediate calculations.

B. Results

| Rxn # | solar reflectance (200-2500 nm) | UV (300-400 nm) | visible (400-700 nm) | NIR (700-2500 nm) | ΔT (° C.) | L* | a* | b* | Transmittance (%) at 105 μm thickness | color |
|---|---|---|---|---|---|---|---|---|---|---|
| 31 | 0.80 | 0.59 | 0.76 | 0.88 | 7.6 | 90 | 1 | 7 | 34.4 | Light brown |
| 32 | 0.82 | 0.83 | 0.84 | 0.80 | 6.8 | 93 | 0 | 0 | 11.3 | Light brown |
| 33 | 0.56 | 0.33 | 0.70 | 0.47 | 20.3 | 90 | −13 | −2 | 25.5 | Light blue |
| 34 | 0.51 | 0.65 | 0.56 | 0.44 | 23 | 82 | −18 | −7 | 2.7 | teal |
| 66 | 0.62 | 0.27 | 0.51 | 0.76 | 17.4 | 77 | 6 | 15 | N/A | Light brown |
| 67 | 0.59 | 0.28 | 0.50 | 0.71 | 18.9 | 77 | 5 | 14 | N/A | Light brown |
| 68 | 0.18 | 0.04 | 0.20 | 0.19 | 39.2 | 57 | −24 | 8 | 25.8 | Green |
| 70 | 0.45 | 0.19 | 0.48 | 0.45 | 26.3 | 78 | −18 | −2 | N/A | Blue |
| 71 | 0.72 | 0.41 | 0.63 | 0.84 | 12 | 85 | 3 | 12 | 42.0 | Light brown |
| 72 | 0.50 | 0.66 | 0.45 | 0.54 | 23.3 | 67 | 12 | −13 | 13.1 | Purple |
| 73 | 0.60 | 0.60 | 0.67 | 0.54 | 18.1 | 91 | −16 | 12 | 38.6 | Light green |
| 75 | 0.94 | 0.94 | 0.97 | 0.91 | 0.2 | 99 | 0 | 1 | 51.5 | White |
| 76 | 0.50 | 0.38 | 0.63 | 0.40 | 23.4 | 86 | −18 | −11 | 11.7 | Blue |
| 87 | 0.30 | 0.03 | 0.19 | 0.44 | 33.5 | 50 | 20 | 38 | 0.1 | Brown |
| 88 | 0.27 | 0.03 | 0.14 | 0.43 | 34.9 | 41 | 21 | 29 | 0.7 | Brown |
| 94 | 0.75 | 0.46 | 0.69 | 0.84 | 10.7 | 87 | 3 | 11 | 31.3 | Light brown |
| 98 | 0.39 | 0.45 | 0.49 | 0.29 | 28.9 | 83 | −25 | 16 | 35.7 | Light green |
| 103 | 0.22 | 0.11 | 0.25 | 0.21 | 37.4 | 59 | −1 | 3 | 15.1 | Gray |
| 104 | 0.37 | 0.11 | 0.39 | 0.38 | 30.3 | 72 | −9 | 3 | 4.3 | Dark Green |
| 105 | 0.26 | 0.04 | 0.15 | 0.39 | 35.5 | 45 | 12 | 25 | 0.7 | Brown |
| 106 | 0.62 | 0.40 | 0.52 | 0.75 | 17.3 | 74 | 15 | −2 | 14.7 | Pink |
| 107 | 0.17 | 0.22 | 0.14 | 0.18 | 40.1 | 43 | 5 | −3 | 33.1 | Violet |
| 111 | 0.20 | 0.02 | 0.07 | 0.34 | 38.6 | 29 | 10 | 16 | 0.3 | Black |
| 112 | 0.34 | 0.06 | 0.31 | 0.40 | 31.7 | 68 | 1 | 42 | 6.3 | Yellow |
| 113 | 0.40 | 0.30 | 0.45 | 0.36 | 28.6 | 80 | −15 | 20 | 34.3 | Light green |
| 114 | 0.12 | 0.04 | 0.08 | 0.17 | 42.2 | 35 | 8 | 13 | 13.2 | Brown |
| 115 | 0.26 | 0.11 | 0.30 | 0.25 | 35.4 | 64 | −8 | −1 | 12.4 | brown |
| 116 | 0.38 | 0.14 | 0.43 | 0.36 | 29.6 | 75 | −8 | 3 | 5.9 | Dark green |
| 117 | 0.34 | 0.03 | 0.21 | 0.51 | 31.4 | 52 | 11 | 29 | 3.1 | Dark brown |
| 118 | 0.30 | 0.03 | 0.16 | 0.46 | 33.7 | 45 | 17 | 33 | 2.0 | Brown |
| 119 | 0.15 | 0.03 | 0.10 | 0.21 | 40.7 | 40 | 8 | 22 | 2.0 | Brown |
| 120 | 0.39 | 0.08 | 0.42 | 0.39 | 29.3 | 77 | −18 | 18 | 9.3 | Green |
| 121 | 0.39 | 0.19 | 0.50 | 0.32 | 29.1 | 80 | −24 | −4 | 15.5 | Teal |
| 122 | 0.42 | 0.30 | 0.39 | 0.47 | 27.5 | 68 | 6 | 1 | 6.4 | pink |
| 123 | 0.21 | 0.03 | 0.12 | 0.32 | 37.8 | 42 | 10 | 22 | 0.0 | Brown |
| 124 | 0.42 | 0.14 | 0.46 | 0.41 | 27.8 | 79 | −16 | 12 | N/A | Green |
| 125 | 0.20 | 0.02 | 0.11 | 0.29 | 38.7 | 42 | 9 | 28 | 2.2 | Dark brown |
| 127 | 0.23 | 0.03 | 0.11 | 0.36 | 37.2 | 39 | 9 | 20 | 0.3 | Dark brown |
| 128 | 0.25 | 0.03 | 0.16 | 0.36 | 36.1 | 48 | 7 | 32 | 9 | Brown |
| 129 | 0.42 | 0.15 | 0.39 | 0.47 | 27.8 | 70 | −3 | 5 | 5.6 | Gray |

| Rxn # | solar reflectance (200-2500 nm) | UV (300-400 nm) | visible (400-700 nm) | NIR (700-2500 nm) | ΔT (° C.) | L* | a* | b* | Transmittance (%) at 105 μm thickness | color |
|---|---|---|---|---|---|---|---|---|---|---|
| 130 | 0.14 | 0.02 | 0.06 | 0.24 | 41.2 | 29 | 4 | 12 | 3.8 | Dark brown |
| 131 | 0.18 | 0.04 | 0.11 | 0.27 | 39.2 | 40 | 8 | 17 | 1.9 | Brown |
| 132 | 0.21 | 0.03 | 0.11 | 0.33 | 38 | 40 | 7 | 21 | 1.1 | brown |

Figure 5:
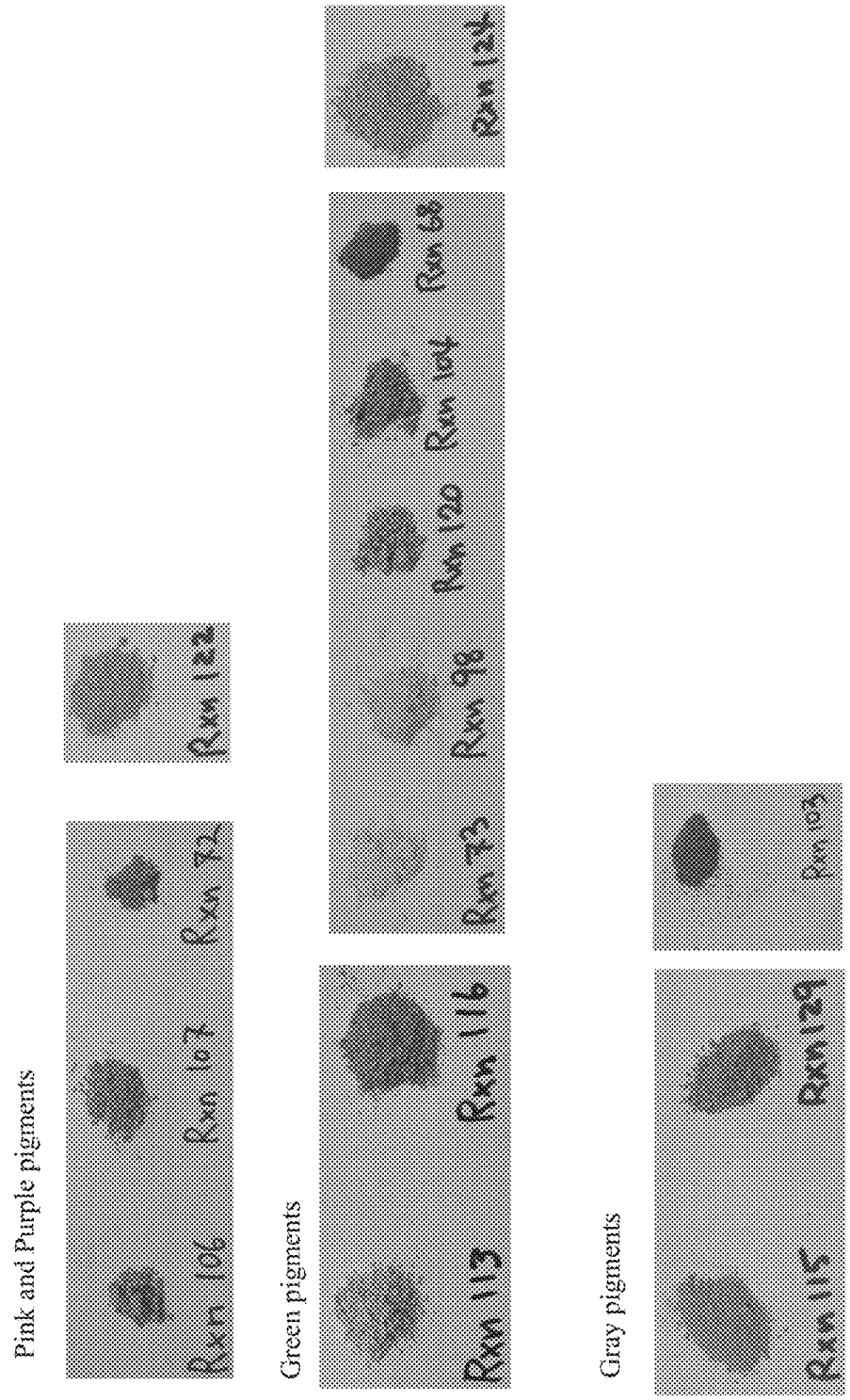
FIG. 5 provides pictures of cool pigments of different colors, in accordance with embodiments of the invention.
Figure 5:
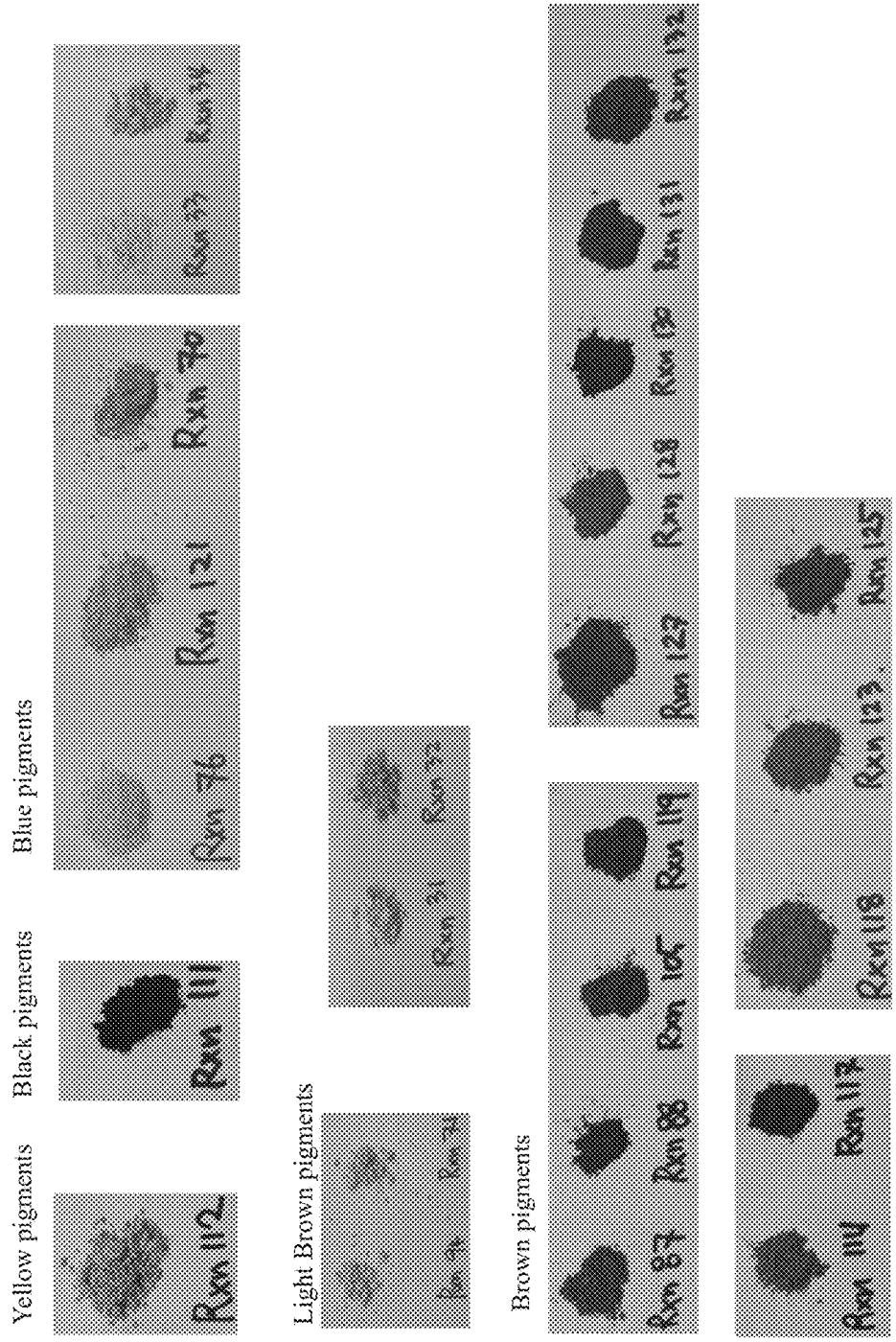

Additional results are provided in FIG. 5.

III. Photovoltaic Devices with Carbonate Backsheets

A. Introduction

The solar cell backsheet is the outer layer of the photovoltaic (PV) module and is designed to protect the inner components of the module, specifically the photovoltaic cells and electrical components, from external stresses as well as act as an electric insulator. In order to accomplish these functions, the solar backsheet must be a robust construction and have high dielectric properties.

Nowadays, there is a high demand for solar cell backsheet manufacturers to increase solar reflectance of the backsheets. The high heat absorption of backsheet can considerably decrease solar cell efficiency. It has been reported that the optimal operating temperature for photovoltaics is around 47° C. (see Published U.S. Patent Application No 2013/0276876 to Kerkar et al.). Around 1° C. increase of temperature from 47° C. can reduce efficiency of solar cells by 0.5%. In other words, increasing the reflectance of backsheets can increase the solar cell efficiency up to 1.5% (See e.g., Photon International, August 2013 p 44-57). Madico Inc. at 28th EU PVSEC September 2013 Paris, France has experimentally demonstrated direct correlation between the reflectance of backsheet and PV module maximum power output ($P_{max}$).

We have developed reflective solarcell backsheets to increase solarcell power output, with different varieties of colors for aesthetic purposes. We disclose an economical way to improve solar cell efficiency by simple replacement of a solar cell backsheet with reflective carbonate compressed layer or with IR-reflective carbonate pigment coatings. The carbonate materials as described herein are found to exhibit high infrared reflectance, high strength and high solar stability compared to existing organic polymer backsheets. In addition to making pure $CaCO_3$ coatings or cements, powdered $CaCO_3$ can also be mixed with different polymers or other materials to increase the strength/flexibility and to decrease water vapor permeability and weatherability of the carbonate material containing backsheet.

B. Materials and Methods

1. White and Colored Carbonate Pigment Syntheses for Backsheet Coating

The following general reaction was employed to produce both white and colored carbonate coating materials:

$$MCl_2 + 2NaHCO_3 \rightarrow MCO_3 + CO_2 + H_2O + 2NaCl$$

Where: M=different combinations of Ca, Mg, Fe, Co, Ni, Cu, Mn, Zn

For the precipitation reaction, bicarbonate ($NaHCO_3$) solution was slowly added to metal chloride solutions (dual decomposition) containing different mixtures of Ca and Mg according to the reactions in following table. For vaterite synthesis, bicarbonate solutions were mixed with sodium sulfate ($Na_2SO_4$) to induce vaterite synthesis. The precipitated carbonates were settled for 30 minutes and filtered through 0.45 μm filter, and dried for 7 days at ambient condition. The resultant white coating materials are summarized in section "a" below while the resultant colored coating materials are summarized in section "b" below.

a. Reflective White Coating Materials

| $CaCO_3$ | Reaction process |
|---|---|
| Calcite 1 | (8 L: 1M CaCl2) + (8 L: 1M $NaHCO_3$) stirred for 1 hour |
| Calcite 2 | (1 L: 0.5M $CaCl_2$) + (1 L: 0.5M $NaHCO_3$) stirred for 1 hour |
| Vaterite | (56 L: 0.13M $CaCl_2$ + 0.05M $MgCl_2$) + (28 L: 0.18M $NaHCO_3$ + 0.05M $Na_2SO_4$) stirred for 1 hour |
| Amorphous calcium carbonate (ACC) | (42 L: 0.15M $CaCl_2$ + 0.6M $MgCl_2$) + (42 L: 0.75M $NaHCO_3$) stirred for 1 hour |
| Aragonite | (42 L: 0.15M $CaCl_2$ + 0.6M $MgCl_2$) + (42 L: 0.75M $NaHCO_3$) stirred for 1 hour and settled overnight and then fully dried | b. Reflective Colored Coating Materials

| Rxn # | Reaction process |
|---|---|
| 32 | (1 L: 0.5M $MnCl_2$) + (1 L: 1M $NaHCO_3$) stirred for 1 hour |
| 49 | (1 L: 0.5M $CaCl_2$) + (1 L: 0.5M $NaHCO_3$) stirred for 1 hour |
| 70 | 250 ml (1M $Na_2CO_3$) + 2.5 ml (1.57M $CuCl_2$) stirred for 5 minutes |
| 72 | 100 ml (0.6M $CoCl_2$) + 400 ml (0.6M $NaHCO_3$) stirred for 1 hour |
| 73 | 250 ml (0.5M $NiCl_2$) + 250 ml (0.5M $NaHCO_3$) stirred for one hour |
| 76 | 100 ml (0.375M $CuCl_2$ + 1.125M $ZnCl_2$) + 1 L (0.2M $NaHCO_3$) stirred for 1 hour |
| 106 | 250 ml (0.25M $CoCl_2$ + O.25M $MnCl_2$) + 250 ml (1M $NaHCO_3$) stirred for 1 hour |
| 111 | 250 ml (0.25M $FeCl_2$ + 0.25M $MnCl_2$) + 250 ml (1M $NaHCO_3$) stirred for 2 hours |
| 117 | 250 ml (0.33M $CoCl_2$ + 0.33M $FeCl_2$ + 0.33M $MnCl_2$) + 250 ml (1M $Na_2CO_3$) stirred for 1 day |
| 121 | 250 ml (0.25M $CuCl_2$ + 0.25M $NiCl_2$) + 250 ml (1M $NaHCO_3$) stirred for 1 hour |
| 129 | 250 ml (0.25M $CoCl_2$ + 0.25M $CuCl_2$ + 0.25M $MnCl_2$ + 0.25M $NiCl_2$) + 250 ml (1M $Na_2CO_3$) stirred for 1 day |
| 149 | 250 ml (0.09M $FeCl_2$ + O.36M $NiCl_2$ + 0.05M $CaCl_2$) + 250 ml (1M $NaHCO_3$) stirred overnight |
| 156 | 250 ml (0.25M $FeCl_2$ + 0.25M $CaCl_2$) + 250 ml (1M $Na_2CO_3$) stirred for 1 day |
| 158 | 250 ml (0.25M $FeCl_2$ + 0.25M $CaCl_2$) + 250 ml (1M $NaHCO_3$) stirred for 1 day |
| 159 | 250 ml (0.4M $FeCl_2$ + 0.1M $ZnCl_2$) + 250 ml (1M $NaHCO_3$) stirred for 1 hour |

-continued

| Rxn # | Reaction process |
|---|---|
| 161 | 250 ml (0.2M $FeCl_2$ + 0.2M $MnCl_2$ + 0.1M $CaCl_2$) + 250 ml (1M $NaHCO_3$) stirred for 3 hours |
| 164 | 250 ml (0.05M $CoCl_2$ + 0.05M $FeCl_2$ + 0.4M $MnCl_2$) + 250 ml (1M $NaHCO_3$) stirred for 2 hours |

2. Preparation Method for Carbonate Compressed Layer

Powdered pigments produced as described in section B.1 above were compacted as pellets to obtain a smoothed surface. In order to make a robust white compressed layer, 1:1 weight ratio of vaterite and ACC is blended with 1M $Na_2CO_3$ with 8:1 powder to liquid ratio. The powder-liquid combination was compressed in a cylinder-shaped die and inserted into Carver Presser. The mixtures were compressed at 20,000 lbf for 30 minutes and taken out as thin pellet samples. The pelletized samples were cured in 1M $Na_2CO_3$ for 14 days. The pelletized samples were found to exhibit up to 10,000 psi strength.

3. Solar Reflectance Analysis

Solar reflectance spectra were collected using Perkin-Elmer Lambda 950 UV-Vis-NIR spectrometer loaded with a 150 mm Integrating Sphere. The data were recorded using UV Winlab 6.0.2 software with 5 nm intervals. The solar reflectance was calculated based on clear sky Air Mass 1 Global Horizontal (AM1GH) and ASTM Standard E892-87 terrestrial solar irradiance to compute solar (averaged over range, 300-2500 nm), UV (averaged over range, 300-400 nm), visible (averaged over range, 400-700 nm), and near-infrared (averaged over range, 700-2500 nm) reflectance.

4. Transmittance Sample Preparation and Measurement 0.4 g of pulverized pigments were mixed thoroughly with 2 g of Titebond II Premium Wood Glue. On a microscope glass that had been cleaned and sonicated with ethanol, the pigment-glue mixture was uniformly applied using 105 μm-thick tapes (Scotch Masking Tape). When the microscope thin film coatings were fully dry, the masking tapes were removed for transmittance measurements.

Transmittance spectra were collected using Perkin-Elmer Lambda 950 UV-Vis-NIR spectrometer loaded with a 150 mm Integrating Sphere. The data were recorded using UV Winlab 6.0.2 software with 1 nm intervals. The background spectrum was collected using a microscope glass with 2 g Titebond glue coated film. The transmittance values were calculated by averaging over 400-700 nm range (visible range).

5. CIELAB Color Coordinate Calculations

CIELAB color coordinates were calculated from solar reflectance data using ASTM standard E308 CIE Standard Illuminants and Responses (2 deg and 10 deg), developed from Lawrence Berkeley National Laboratory. R Studio software was used for immediate calculations.

6. ΔT Calculation

ΔT, defined as the difference between material surface temperature and outside air temperature when exposed to the sun, was evaluated under ASTM E1980 conditions.

C. Results

The results are tabulated below:

| Rxn # | solar reflectance (200-2500 nm) | UV (300-400 nm) | visible (400-700 nm) | NIR (700-2500 nm) | ΔT (° C.) | L* | a* | b* | Transmittance (%) at 105 μm thickness | color |
|---|---|---|---|---|---|---|---|---|---|---|
| 31 | 0.80 | 0.59 | 0.76 | 0.88 | 7.6 | 90 | 1 | 7 | 34.4 | Light brown |
| 33 | 0.56 | 0.33 | 0.70 | 0.47 | 20.3 | 90 | −13 | −2 | 25.5 | Light blue |
| 49 | 0.96 | 0.91 | 0.97 | 0.96 | 0 | 99 | 0 | 1 | 34.4 | white |
| 67 | 0.59 | 0.28 | 0.50 | 0.71 | 18.9 | 77 | 5 | 14 | N/A | Light brown |
| 70 | 0.56 | 0.33 | 0.70 | 0.47 | 20.3 | 90 | −13 | −2 | 25.5 | blue |
| 71 | 0.72 | 0.41 | 0.63 | 0.84 | 12 | 85 | 3 | 12 | 42.0 | Light brown |
| 72 | 0.50 | 0.66 | 0.45 | 0.54 | 23.3 | 67 | 12 | −13 | 13.1 | Purple |
| 73 | 0.60 | 0.60 | 0.67 | 0.54 | 18.1 | 91 | −16 | 12 | 38.6 | Light green |
| 76 | 0.50 | 0.38 | 0.63 | 0.40 | 23.4 | 86 | −18 | −11 | 11.7 | Blue |
| 94 | 0.75 | 0.46 | 0.69 | 0.84 | 10.7 | 87 | 3 | 11 | 31.3 | Light brown |
| 106 | 0.62 | 0.40 | 0.52 | 0.75 | 17.3 | 74 | 15 | −2 | 14.7 | Pink |
| 111 | 0.20 | 0.02 | 0.07 | 0.34 | 38.6 | 29 | 10 | 16 | 0.3 | Black |
| 117 | 0.34 | 0.03 | 0.21 | 0.51 | 31.4 | 52 | 11 | 29 | 3.1 | Dark brown |
| 121 | 0.39 | 0.19 | 0.50 | 0.32 | 29.1 | 80 | −24 | −4 | 15.5 | Teal |
| 129 | 0.42 | 0.15 | 0.39 | 0.47 | 27.8 | 70 | −3 | 5 | 5.6 | Gray |
| 149 | 0.55 | 0.071 | 0.47 | 0.69 | 20.8 | 80 | −1 | 44 | N/A | yellow |
| 156 | 0.4 | 0.044 | 0.3 | 0.53 | 28.8 | 63 | 16 | 40 | N/A | Brown |
| 158 | 0.34 | 0.029 | 0.21 | 0.5 | 31.6 | 54 | 20 | 42 | N/A | Buff |
| 159 | 0.34 | 0.021 | 0.15 | 0.56 | 31.7 | 42 | 26 | 39 | N/A | Buff |
| 161 | 0.3 | 0.015 | 0.11 | 0.52 | 33.3 | 38 | 17 | 33 | N/A | Brown |
| 164 | 0.44 | 0.022 | 0.23 | 0.7 | 26.5 | 53 | 19 | 41 | N/A | Dark brown |

Typical dielectric constant of $CaCO_3$: 8.19 (Roberts S Phys. Rev. 76 1215 (1949)). Refractive index of $CaCO_3$: 1.65 (Ghosh, G, Opt. Commun. 163, 95-102 (1999)).

IV. Carbonate Pigment Coated Granules

A coated granule made up of a non-carbonate pigment core, such as such as quartzite, rhyolite, limestone, is prepared that includes a calcium carbonate coating calcium carbonate coating of any thickness to achieve high solar reflectance. While the core can be coated with a calcium carbonate material using any convenient protocol, in some instances continuous protocol as described PCT Application Serial No. US2015/018361, the disclosure of which is incorporated herein by reference, is employed.

To produce a cool carbonate pigment coating on the outer surface of the coated granules, the coated granules are submerged in solution containing a cool carbonate pigment, such as described in part II, above, for an amount of time sufficient to obtain the color characteristics of pigment but keep the solar reflectance characteristics of the calcium carbonate coating and to cure the calcium carbonate by recrystallization in order to increase the strength of the calcium carbonate coating.

Figure 6:
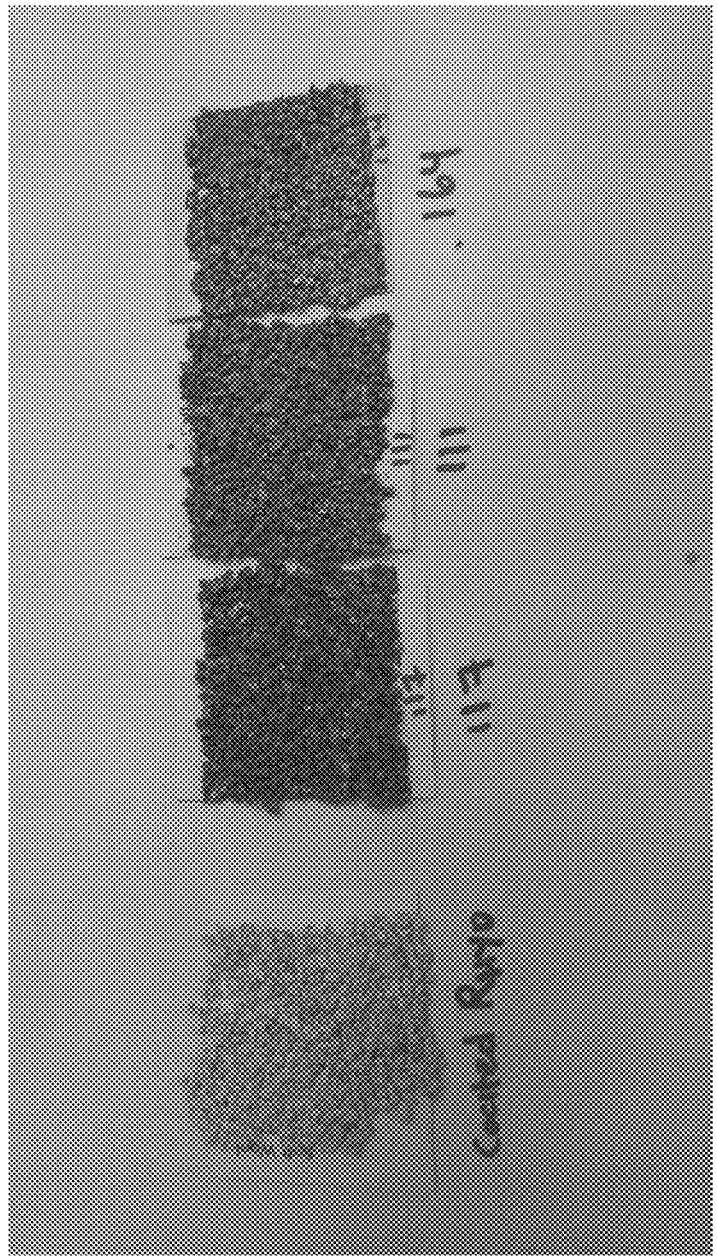
FIG. 6 provides reflectance characteristics of calcium carbonate coated rhyolite granules and then granules coated with carbonate pigments on a shingle, as reported in the Experimental Section, below.
Figure 7:
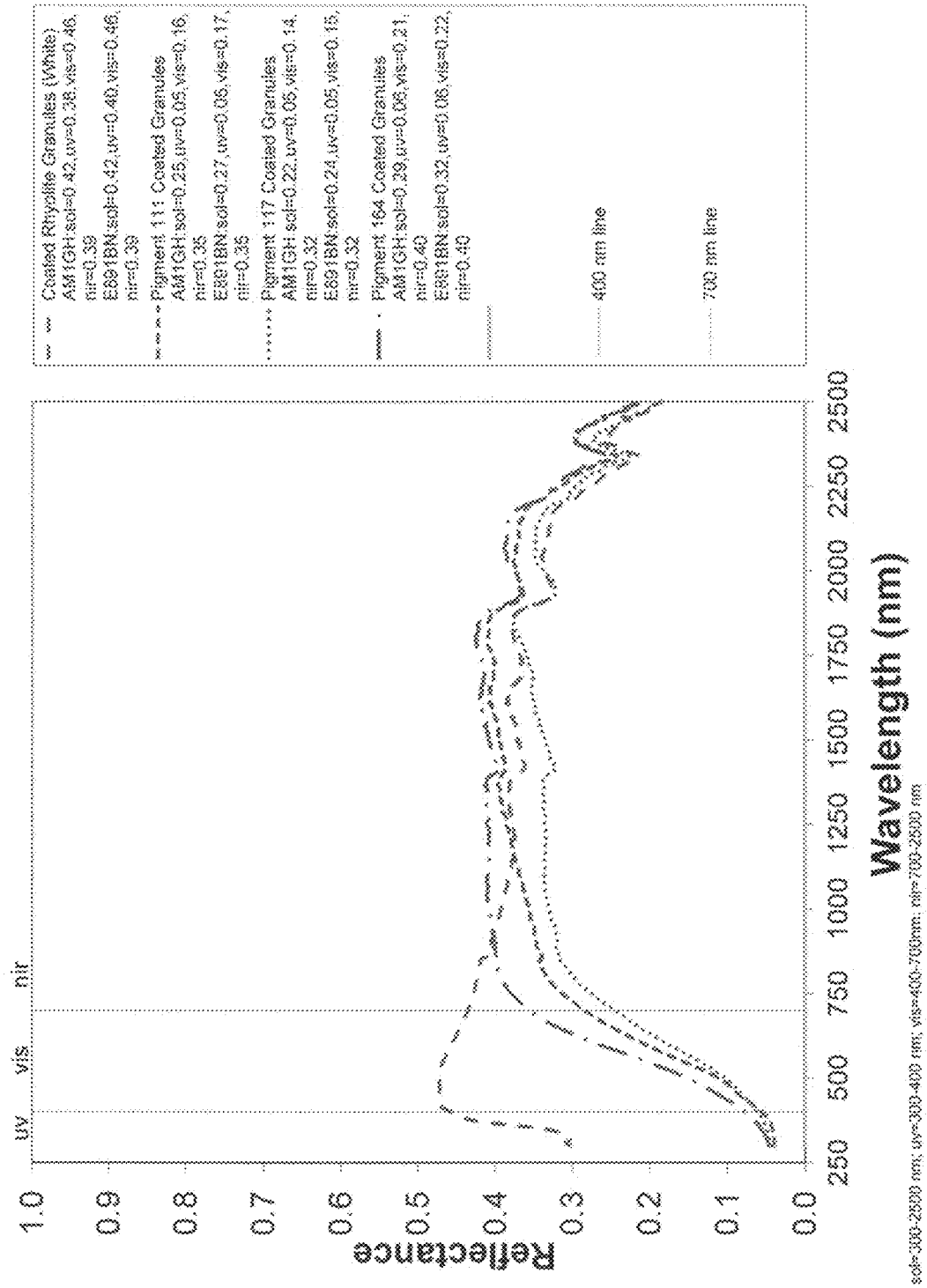
FIG. 7 provides solar reflectance measurements of the pigment coated granules shown in FIG. 6.

The resultant granules are allowed to cure or soak in the solution for 1 day to 1 week of time and they are dried either in air or in the oven. The resultant granules are shown in FIG. 6. Then the solar reflectance is measured using the standard techniques. The results are provided in FIG. 7.

The above experiment demonstrates the ability to coat carbonate granules with a carbonate pigment in order to produce a range of visible and NIR reflective colored roofing granules.

Notwithstanding the appended clauses, the disclosure is also defined by the following clauses:
1. A highly reflective carbonate white pigment composition.
2. The composition according to Clause 1, wherein the composition exhibits an average transmittance from 400 to 700 nm that is 56% or less.
3. The composition according to Clause 2, wherein the composition exhibits an average transmittance from 400 to 700 nm that is 56.5% or less.
4. The composition according to Clause 3, wherein the composition exhibits an average transmittance from 400 to 700 nm that is 48% or less.
5. The composition according to Clause 4, wherein the composition exhibits an average transmittance from 400 to 700 nm that is 36% or less.
6. The composition according to any of the preceding clauses, wherein the composition comprises microcrystalline/amorphous carbonate.
7. The composition according to Clause 6, wherein the microcrystalline/amorphous carbonate has a crystal size ranging from 0.001 µm to 100 µm.
8. The composition according to Clause 7, wherein the microcrystalline/amorphous carbonate component comprises at least one of calcium carbonate and magnesium carbonate.
9. The composition according to Clause 8, wherein the microcrystalline/amorphous carbonate component comprises both a calcium carbonate and a magnesium carbonate.
10. The composition according to any of the preceding clauses, wherein the carbonate pigment composition is a $CO_2$ sequestering material.
11. The composition according to any of the preceding clauses, wherein the carbonate pigment composition is prepared by:
    contacting a $CO_2$ containing gas with an aqueous medium under conditions sufficient to produce a bicarbonate rich product; and
    precipitating a microcrystalline or amorphous carbonate from the bicarbonate rich product.
12. The composition according to any of the preceding clauses, wherein the composition is a granular composition.

13. A method of producing a highly reflective/high refractive index carbonate pigment composition, the method comprising:
    contacting a $CO_2$ containing gas with an aqueous medium under conditions sufficient to produce a bicarbonate rich product; and
    precipitating a microcrystalline or amorphous carbonate from the bicarbonate rich product to produce a highly reflective carbonate pigment composition.
14. The method according to Clause 13, wherein the $CO_2$ containing gas comprises anthropogenic $CO_2$.
15. A coating composition, the composition comprising:
    a carbonate pigment composition according to any of Clauses 1 to 12, and
    a vehicle component.
16. The coating composition according to Clause 15, wherein the composition is an architectural paint.
17. The coating composition according to Clause 15, wherein the coating is an industrial coating.

Notwithstanding the appended clauses, the disclosure is also defined by the following clauses:
1. A cool carbonate pigment composition comprising a transition metal carbonate.
2. The cool carbonate pigment composition according to Clause 1, wherein the transition metal is a period 4 transition metal.
3. The cool carbonate pigment composition according to Clause 2, wherein the period 4 transition metal is selected from the group consisting of Mn, Fe, Ni, Cu, Co, Zn.
4. The cool carbonate pigment composition according to any of Clauses 1 to 3, wherein the composition comprises two or more distinct transition metal carbonates.
5. The cool carbonate pigment composition according to any of the preceding clauses, wherein the composition exhibits an average transmittance that is 55.0 or less.
6. The cool carbonate pigment composition according to any of the preceding clauses, wherein the composition has a total solar reflectance ranging from 0.1 to 0.9.
7. The cool carbonate pigment composition according to any of the preceding clauses, wherein the composition comprises microcrystalline/amorphous carbonate.
8. The cool carbonate pigment composition according to Clause 7, wherein the microcrystalline/amorphous carbonate has a crystal size ranging from 0.001 µm to 100 µm.
9. The cool carbonate pigment composition according to Clause 8, wherein the microcrystalline/amorphous carbonate component comprises at least one of calcium carbonate and magnesium carbonate, and transition metal carbonates.
10. The cool carbonate pigment composition according to any of the preceding clauses, wherein the carbonate pigment composition is a $CO_2$ sequestering material.
11. The cool carbonate pigment composition according to any of the preceding clauses, wherein the carbonate pigment composition is prepared by:
    contacting a $CO_2$ containing gas with an aqueous medium under conditions sufficient to produce a bicarbonate/carbonate rich product; and
    precipitating a microcrystalline or amorphous carbonate in the presence of a transition metal from the bicarbonate/carbonate rich product.
12. The cool carbonate pigment composition according to any of the preceding clauses, wherein the composition is a granular composition.
13. The cool carbonate pigment composition according to any of the preceding clauses, wherein the composition has a color selected from the group consisting of black, brown, blue, green, grey, pink, purple, teal, violet and yellow.

14. A method of producing a cool carbonate pigment composition, the method comprising:
  contacting a $CO_2$ containing gas with an aqueous medium under conditions sufficient to produce a bicarbonate/carbonate rich product; and
  precipitating a microcrystalline or amorphous carbonate in the presence of a transition metal from the bicarbonate/carbonate rich product to produce a cool carbonate pigment composition.
15. The method according to Clause 14, wherein the $CO_2$ containing gas comprises anthropogenic $CO_2$.
16. A coating composition, the composition comprising:
  a cool carbonate pigment composition according to any of Clauses 1 to 13, and
  a vehicle component.
17. The coating composition according to Clause 16, wherein the composition is an architectural paint.
18. The coating composition according to Clause 16, wherein the coating is an industrial coating.
19. A composition of matter comprising:
  a solid support; and
  a cool carbonate pigment composition on a surface of the support.

Notwithstanding the appended clauses, the disclosure is also defined by the following clauses:
1. A photovoltaic device comprising:
  a solar cell; and
  a backsheet comprising a carbonate layer.
2. The photovoltaic device according to Clause 1, wherein the carbonate layer comprises a microcrystalline/amorphous carbonate material.
3. The photovoltaic device according to Clause 2, wherein the microcrystalline/amorphous carbonate material has a crystal size ranging from 0 to 100 μm.
4. The photovoltaic device according to Clauses 2 or 3, wherein the microcrystalline/amorphous carbonate material comprises at least one of calcium carbonate and magnesium carbonate.
5. The photovoltaic device according to any of the preceding clauses, wherein the carbonate material comprises a $CO_2$ sequestering material.
6. The photovoltaic device according to any of the preceding clauses, wherein the carbonate layer has a near infra-red (NIR) reflectance ranging from 30 to 99%.
7. The photovoltaic device according to any of the preceding clauses, wherein the carbonate layer has an ultra-violet (UV) reflectance ranging from 1 to 99%.
8. The photovoltaic device according to any of the preceding clauses, wherein the carbonate layer has a visible light reflectance ranging from 1 to 90%.
9. The photovoltaic device according to Clause 8, wherein the carbonate layer comprises a pigment.
10. The photovoltaic module according to any of the preceding clauses, wherein the carbonate layer has a thickness ranging from 1 to 1000 μm.
11. The photovoltaic device according to any of the preceding clauses, wherein the photovoltaic device is a photovoltaic module.
12. The photovoltaic module according to Clause 11, wherein the photovoltaic modular further comprises a transparent top layer and an encapsulant layer comprising a solar cell.
13. The photovoltaic module according to Clause 12, wherein the backsheet comprises a laminate of the carbonate layer and an additional layer of a material that is different from the carbonate layer, wherein the carbonate layer is positioned between the solar cell and the additional layer.
14. The photovoltaic module according to any of Clauses 11 to 13, wherein the transparent top layer comprises a plastic or a glass.
15. The photovoltaic module according to Clause 14, wherein the encapsulant layer comprises a transparent resin.
16. The photovoltaic device according to any of Clauses 1 to 10, wherein the photovoltaic device is a photovoltaic shingle.
17. A photovoltaic device backsheet comprising a carbonate layer.
18. The photovoltaic device backsheet according to Clause 17, wherein the carbonate layer comprises a microcrystalline/amorphous carbonate material.
19. The photovoltaic backsheet according to Clause 18, wherein the microcrystalline/amorphous carbonate material has a crystal size ranging from 0 to 100 μm.
20. The photovoltaic backsheet according to any of Clauses 18 to 19, wherein the microcrystalline/amorphous carbonate material comprises at least one of calcium carbonate and magnesium carbonate.
21. The photovoltaic backsheet according to any of Clauses 17 to 20, wherein the carbonate material comprises a $CO_2$ sequestering material.
22. The photovoltaic backsheet according to any of Clauses 17 to 21, wherein the carbonate layer has a near infra-red (NIR) reflectance ranging from 30 to 99%.
23. The photovoltaic backsheet according to any of Clauses 17 to 22, wherein the carbonate layer has an ultra-violet (UV) reflectance ranging from 1 to 99%.
24. The photovoltaic backsheet according to any of Clauses 17 to 23, wherein the carbonate layer has a visible light reflectance ranging from 1 to 90%.
25. The photovoltaic backsheet according to any of Clauses 17 to 24, wherein the carbonate layer comprises a pigment.
26. The photovoltaic backsheet according to any of Clauses 17 to 25, wherein the backsheet comprises a laminate of the carbonate layer and an additional layer of a material that is different from the carbonate layer.
27. The photovoltaic backsheet according to any of Clauses 17 to 26, wherein the carbonate layer has a thickness ranging from 1 to 1000 μm.
28. A method of making a photovoltaic module, the method comprising assembling a transparent top layer; an encapsulant; one or more solar cells; and a backsheet comprising a carbonate layer according to any of Clauses 17 to 27 in a manner sufficient to produce a photovoltaic module.
29. A method comprising stably associated a photovoltaic device according to any of Clauses 1 to 16 with a structure.
30. The method according to Clause 29, wherein the structure comprises a building.
31. A method of converting light to electricity, the method comprising:
  irradiating a photovoltaic device according to any of Clauses 1 to 16 with light in a manner sufficient for the photovoltaic module to produce electricity.
32. The method according to Clause 31, wherein the light comprises sunlight.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of present invention is embodied by the appended claims.

What is claimed is:

1. A carbonate pigment composition, wherein the carbonate pigment composition is a $CO_2$ sequestering material having an isotopic profile that identifies the composition as being of fossil fuel origin, that is prepared by:
    contacting a $CO_2$ containing gas comprising anthropogenic $CO_2$ with a bicarbonate buffered aqueous medium having a pH that ranges from 8 to 10 under conditions sufficient to produce a bicarbonate rich product that comprises droplets of a liquid condensed phase (LCP) in a bulk liquid; and
    precipitating a microcrystalline carbonate from the bicarbonate rich product by combining the bicarbonate rich product with a cation source to produce the carbonate pigment composition.

2. The carbonate pigment composition according to claim 1, wherein the carbonate pigment composition is a white pigment composition.

3. The carbonate pigment composition according to claim 1, wherein the composition comprises a transition metal carbonate.

4. The carbonate pigment composition according to claim 3, wherein the transition metal of the transition metal carbonate is a period 4 transition metal.

5. The carbonate pigment composition according to claim 4, wherein the period 4 transition metal is selected from the group consisting of Mn, Fe, Ni, Cu, Co, Zn.

6. The carbonate pigment composition according to claim 3, wherein the composition comprises two or more distinct transition metal carbonates.

7. The carbonate pigment composition according to claim 1, wherein the composition is a granular composition.

8. The carbonate pigment composition according to claim 1, wherein the $CO_2$ sequestering material comprises microcrystalline carbonate having a crystal size ranging from 0.001 μm to 100 μm.

9. The carbonate pigment composition according to claim 7, wherein the granular composition comprises a non-carbonate pigment core coated with the carbonate pigment composition.

10. The carbonate pigment composition according to claim 1, wherein the composition exhibits an average transmittance from 400 to 700 nm that is 56.5 or less.

11. The carbonate pigment composition according to claim 1, wherein the composition exhibits a total surface reflectance ranging from 0.40 to 0.98.

12. The carbonate pigment composition according to claim 1, wherein the $CO_2$ containing gas is a waste stream from an industrial plant.

13. The carbonate pigment composition according to claim 12, wherein the waste stream is a flue gas.

14. The carbonate pigment coating composition according to claim 3, the composition further comprising: a vehicle component.

15. A photovoltaic device comprising:
    a solar cell; and
    a backsheet comprising a carbonate layer comprising a carbonate pigment composition according to claim 1.

16. A method of producing a carbonate pigment composition, the method comprising:
    contacting a $CO_2$ containing gas comprising anthropogenic $CO_2$ with a bicarbonate buffered aqueous medium having a pH that ranges from 8 to 10 to produce a bicarbonate rich product that comprises droplets of a liquid condensed phase (LCP) in a bulk liquid; and
    precipitating a microcrystalline carbonate from the bicarbonate rich product by combining the bicarbonate rich product with a cation source;
    to produce a carbonate pigment composition that is a $CO_2$ sequestering material having an isotopic profile that identifies the composition as being of fossil fuel origin.

17. The method according to claim 16, wherein the precipitating occurs in the presence of a transition metal.

18. The method according to claim 16, wherein the $CO_2$ containing gas is a waste stream from an industrial plant.

19. The method according to claim 16, further comprising a curing step.

20. The method according to claim 16, wherein the method produces an amount of $CO_2$ from the bicarbonate rich product.

* * * * *

UNITED STATES PATENT AND TRADEMARK OFFICE
CERTIFICATE OF CORRECTION

PATENT NO.        : 10,287,439 B2
APPLICATION NO.   : 15/443798
DATED             : May 14, 2019
INVENTOR(S)       : Brent R. Constantz et al.

Page 1 of 1

It is certified that error appears in the above-identified patent and that said Letters Patent is hereby corrected as shown below:

In the Specification

Please replace "$(Ca_2Mg-(CO_3)_{13}.H_2O)$" with -- $(Ca_2Mg_{11}-(CO_3)_{13}.H_2O)$ -- (Column 9, Lines 56-57).

Please replace "value 85" with -- value of 85 -- (Column 21, Line 6).

Please replace "ethylene-30" with -- ethylene-3Q -- (Column 23, Line 8).

Signed and Sealed this
Seventeenth Day of September, 2019

Andrei Iancu
*Director of the United States Patent and Trademark Office*